(12) United States Patent
Lee et al.

(10) Patent No.: US 12,379,753 B2
(45) Date of Patent: Aug. 5, 2025

(54) DISPLAY DEVICE

(71) Applicant: SAMSUNG DISPLAY CO., LTD., Yongin-si (KR)

(72) Inventors: Sang Jin Lee, Suwon-si (KR); Young Dae Kim, Seoul (KR); Hee Na Kim, Hwaseong-si (KR); In Kyung Yoo, Hwaseong-si (KR)

(73) Assignee: SAMSUNG DISPLAY CO., LTD., Suwon-si (KR)

( * ) Notice: Subject to any disclaimer, the term of this patent is extended or adjusted under 35 U.S.C. 154(b) by 0 days.

(21) Appl. No.: 18/603,328

(22) Filed: Mar. 13, 2024

(65) Prior Publication Data

US 2024/0264642 A1 Aug. 8, 2024

Related U.S. Application Data

(62) Division of application No. 17/719,533, filed on Apr. 13, 2022, now Pat. No. 11,953,951.

(30) Foreign Application Priority Data

Aug. 18, 2021 (KR) .......................... 10-2021-0108638

(51) Int. Cl.
*G06F 1/16* (2006.01)
*G09F 9/30* (2006.01)
*G09F 9/302* (2006.01)
*H04M 1/02* (2006.01)
*H10K 59/40* (2023.01)

(52) U.S. Cl.
CPC .......... *G06F 1/1684* (2013.01); *G06F 1/1652* (2013.01); *G09F 9/301* (2013.01); *G09F 9/302* (2013.01); *H04M 1/0268* (2013.01); *H10K 59/40* (2023.02); *C09K 2323/00* (2020.08); *H04M 2250/12* (2013.01)

(58) Field of Classification Search
CPC ...... G06F 1/1684; G06F 1/1652; G09F 9/301; G09F 9/302; H04M 1/0268; H04M 2250/12; C09K 2323/00
USPC ....................................... 361/679.02; 428/1.1
See application file for complete search history.

(56) References Cited

U.S. PATENT DOCUMENTS

| | | |
|---|---|---|
| 2013/0199916 A1 | 8/2013 | Iwamoto |
| 2018/0095581 A1 | 4/2018 | Hwang et al. |
| 2018/0174523 A1* | 6/2018 | Jeon ..................... H10K 59/131 |
| 2023/0054198 A1 | 2/2023 | Lee et al. |

FOREIGN PATENT DOCUMENTS

| | | |
|---|---|---|
| KR | 10-2020-0078176 | 7/2020 |
| KR | 10-2140235 | 8/2020 |
| KR | 10-2224743 | 3/2021 |

\* cited by examiner

*Primary Examiner* — Ruiyun Zhang
(74) *Attorney, Agent, or Firm* — F. CHAU & ASSOCIATES, LLC

(57) ABSTRACT

A display device including: a first elastic member; a display portion disposed on the first elastic member; and a sensing material layer disposed between the first elastic member and the display portion, wherein the display portion including a first island pattern, a second island pattern, and a slit, wherein the first island pattern and the second island pattern are spaced apart from each other with the slit therebetween, and each of the first island pattern and the second island pattern includes a pixel, and wherein the sensing material layer overlaps the slit.

8 Claims, 34 Drawing Sheets

FIG. 4
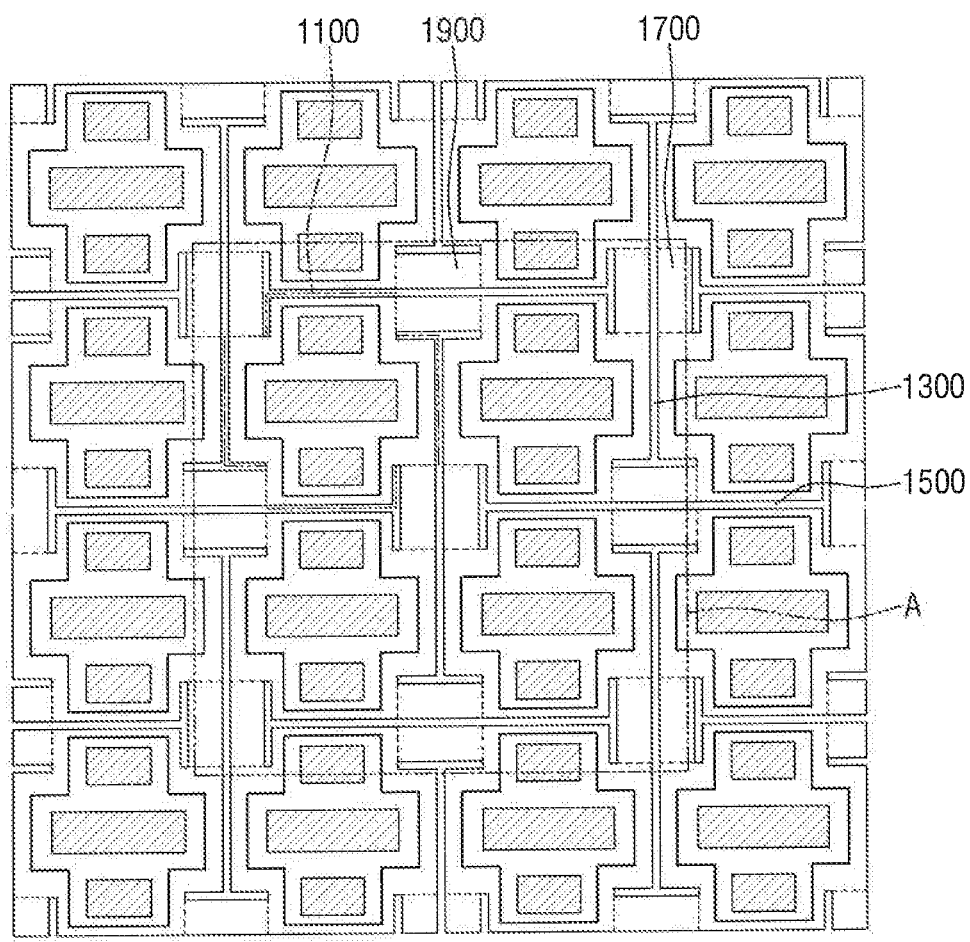
DS: 1100, CNP, SL
SL: 1300, 1500
CNP: 1700, 1900
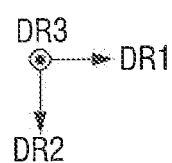

FIG. 5
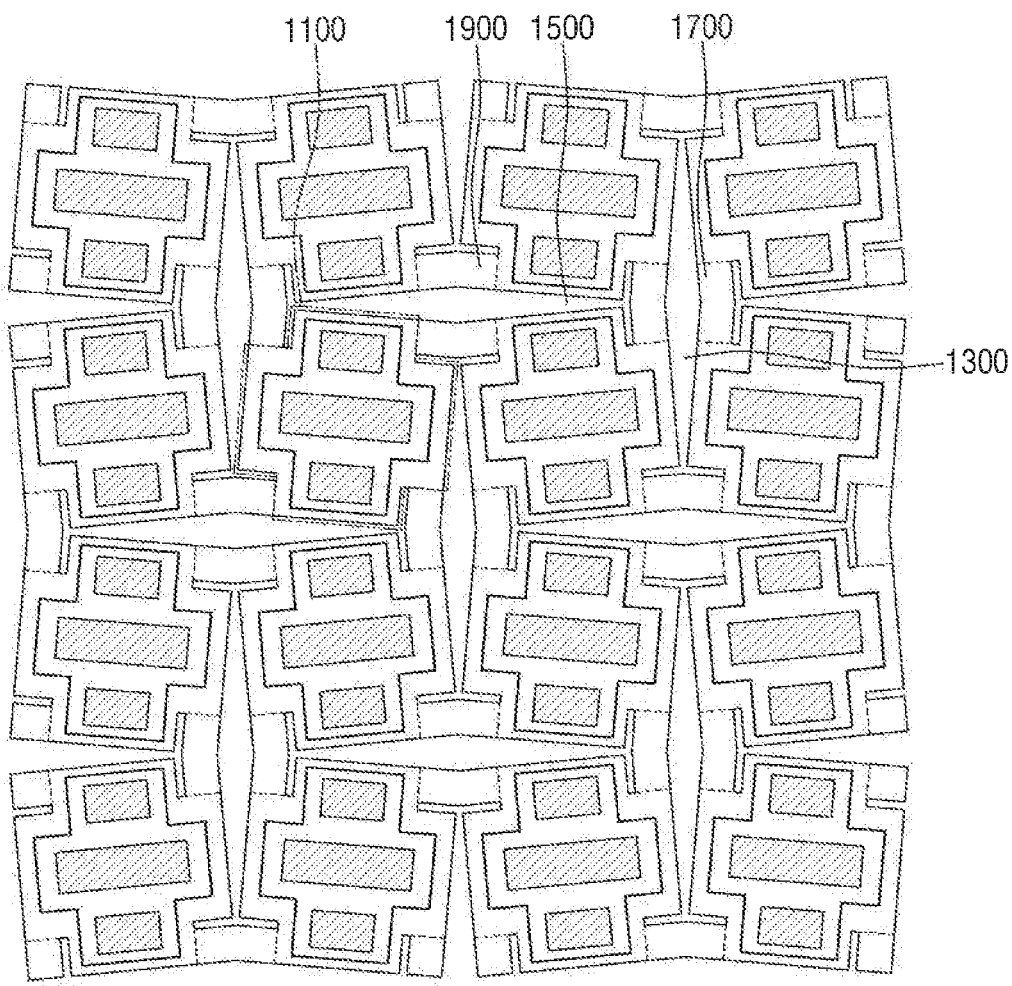
DS: 1100, CNP, SL
SL: 1300, 1500
CNP: 1700, 1900
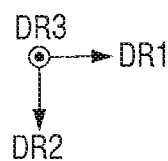

DISPLAY DEVICE

This application is a divisional application of U.S. patent application Ser. No. 17/719,533 filed Apr. 13, 2022, which claims priority under 35 U.S.C. § 119 to Korean Patent Application No. 10-2021-0108638 filed on Aug. 18, 2021 in the Korean Intellectual Property Office, the disclosures of which are incorporated by reference herein in their entireties.

1. TECHNICAL FIELD

The present disclosure relates to a flexible display device.

2. DESCRIPTION OF THE RELATED ART

A display device is an output device for presentation of information in visual form. Display devices are becoming more and more ubiquitous as multimedia technology evolves. As such, a variety of display devices such as organic light-emitting display devices and liquid-crystal display devices are currently being used and further developed.

As display technology evolves, demand for display devices having various features is increasing. For example, a flexible display that can be extended or reduced in size by folding, bending or sliding, and a stretchable display that can change into various shapes have been developed.

SUMMARY

Aspects of the present disclosure provide a display device that can increase the sensing sensitivity of external stimuli applied to a display and incorporate a sensing material layer into a display panel to facilitate volume reduction or design change of the display device.

According to an embodiment of the present disclosure, a display device includes: a first elastic member; a display portion disposed on the first elastic member; and a sensing material layer disposed between the first elastic member and the display portion, wherein the display portion includes a first island pattern, a second island pattern, and a slit, wherein the first island pattern and the second island pattern are spaced apart from each other with the slit therebetween, and each of the first island pattern and the second island pattern includes a pixel, and wherein the sensing material layer overlaps the slit.

According to an embodiment of the present disclosure, a display device includes: a display panel including an elongated portion having elasticity, a display portion disposed on an upper surface of the elongated portion and a sensor disposed inside the elongated portion; and a controller receiving a sensing signal from the sensor and providing a control signal to the display panel in response to the sensing signal, wherein the display portion includes a slit and a plurality of island patterns spaced apart from one another with the slit therebetween and each of the island patterns includes a pixel, wherein the sensor includes: a first sensing line extended in a second direction; a second sensing line extended in a first direction intersecting the second direction; and a sensing material layer disposed where the first sensing line and the second sensing line intersect each other, and electrically connecting the first sensing line with the second sensing line, and wherein the sensing material layer overlaps the slit.

According to an embodiment of the present disclosure, a display device including: a substrate; a display portion disposed on a first side of the substrate, the display portion including a first island pattern separated from a second island pattern by an opening, each of the first and second island patterns including a pixel; and a sensing portion disposed on a second side of the substrate opposite the first side, the sensing portion including a sensing material layer at an intersection between sensing lines in the opening.

BRIEF DESCRIPTION OF THE DRAWINGS

The above and other features of the present disclosure will become more apparent by describing in detail embodiments thereof with reference to the attached drawings, in which:

FIG. 4 is an enlarged view of a part of a display portion of the display panel in a second state shown in FIG. 2.

FIG. 5 is an enlarged view of a part of the display portion of the display panel in the second state shown in FIG. 2.

DETAILED DESCRIPTION OF THE EMBODIMENTS

The present invention will now be described more fully hereinafter with reference to the accompanying drawings. This invention may however, be embodied in different forms and should not be construed as limited to the embodiments set forth herein.

It will be understood that when a layer is referred to as being "on" another layer or substrate, it can be directly on the other layer or substrate, or intervening layers may also be present. The same reference numbers may indicate the same components throughout the specification.

It will be understood that, although the terms "first," "second," etc. may be used herein to describe various elements, these elements should not be limited by these terms. These terms are used to distinguish one element from another element. For instance, a first element discussed below could be termed a second element. Similarly, the second element could also be termed the first element.

Figure 1:
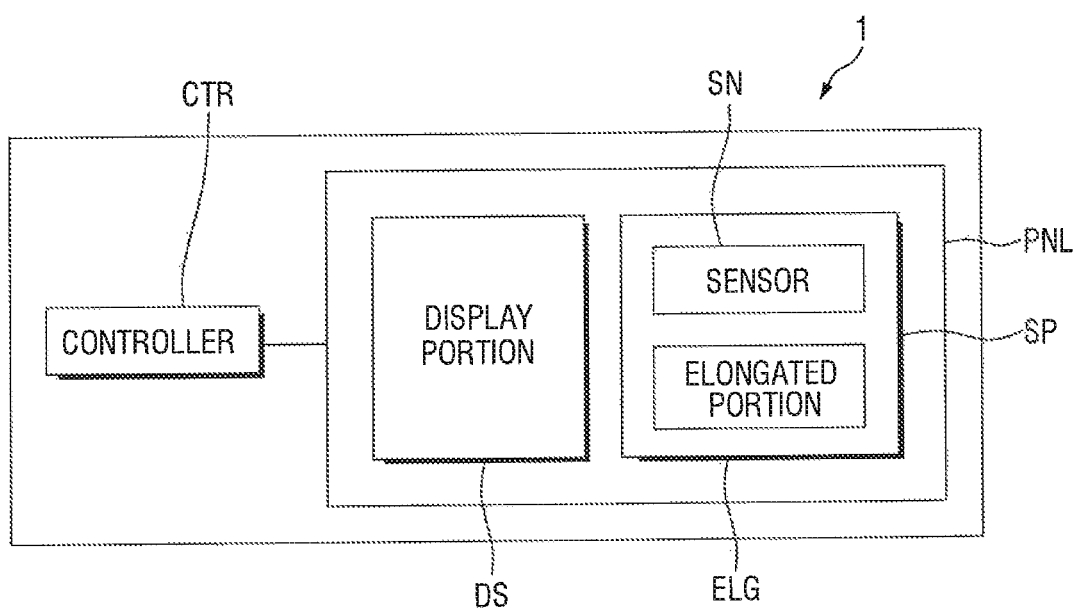
FIG. 1 is a block diagram of a display device according to an embodiment of the present disclosure.
Figure 2:
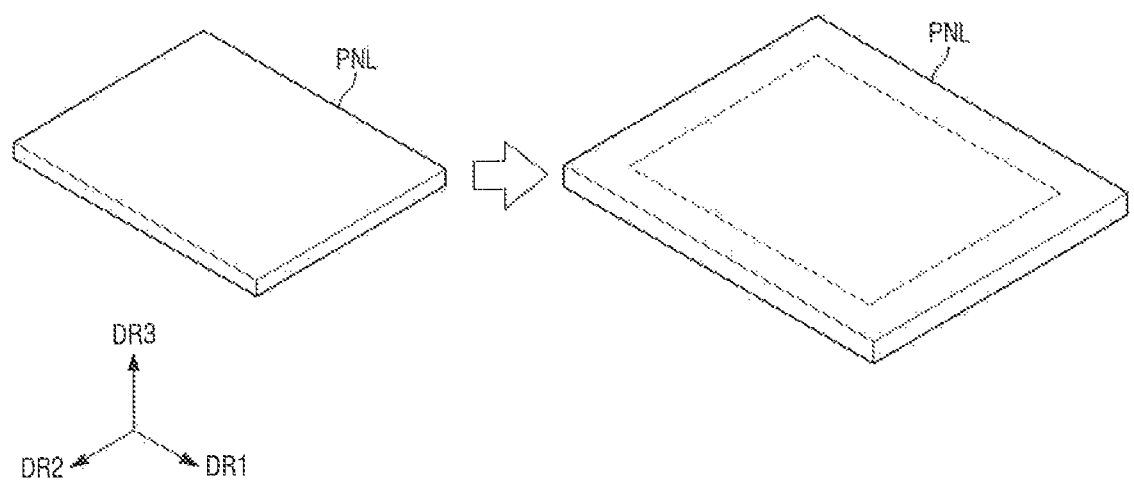
FIG. 2 is a plan view schematically showing a display panel of the display device of FIG. 1.
Figure 3:
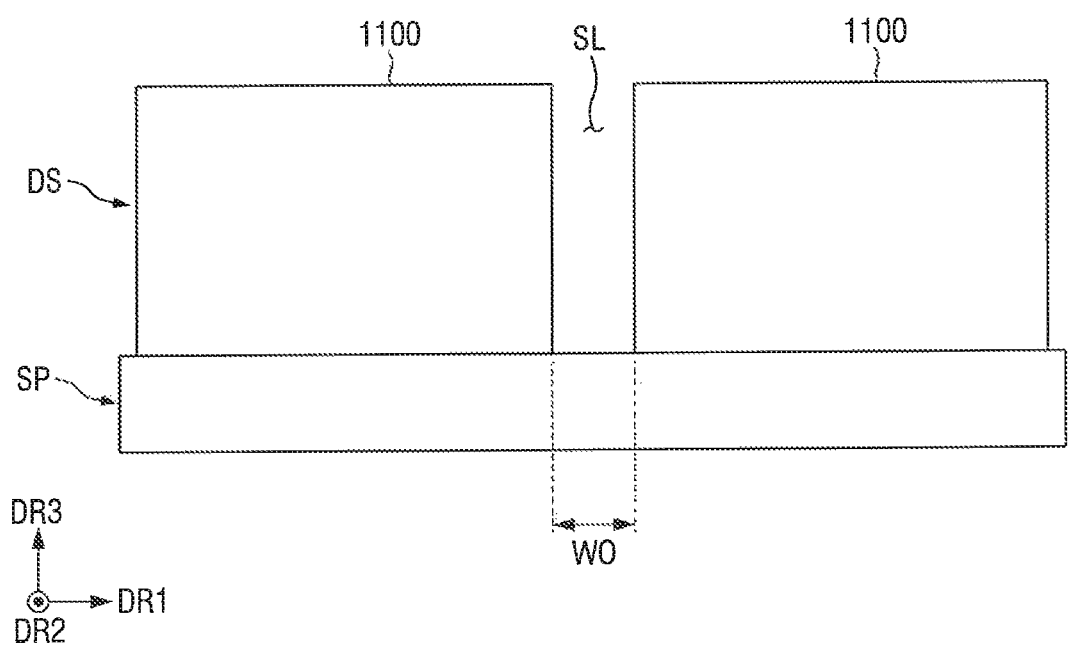
FIG. 3 is a diagram schematically showing the structure of the display panel of FIG. 2.

FIG. 1 is a block diagram of a display device according to an embodiment of the present disclosure. FIG. 2 is a plan view schematically showing a display panel of the display device according to the embodiment of FIG. 1. FIG. 3 is a diagram schematically showing the structure of the display panel of FIG. 2.

Referring to FIG. 1, a display device 1 according to an embodiment of the present disclosure may include a display panel PNL and a controller CTR.

The display panel PNL may display images to a user and may sense an external stimulus. The display panel PNL may include a display portion DS where images are displayed, and a bottom sensing portion SP for supporting the display portion DS and sensing an external stimulus. The bottom sensing portion SP may include a sensor SN for sensing an external stimulus, and an elongated portion ELG that supports the display portion DS and has elasticity so that it can be elongated by an external force.

The display panel PNL displays images thereon. Any kind of display panel may be employed as the display panel PNL according to the present embodiment, such as an organic light-emitting display panel including an organic light-emitting layer, a micro light-emitting diode display panel using micro light-emitting diodes (LEDs), a quantum-dot light-emitting display panel using quantum-dot light-emitting diodes including a quantum-dot light-emitting layer, and an inorganic light-emitting display panel using inorganic light-emitting elements including an inorganic semiconductor.

The controller CTR may control the display panel PNL by providing a control signal to the display panel PNL. For example, the controller CTR may receive a sensing signal corresponding to an external stimulus from the sensor SN and may provide a control signal for controlling the operation of the display panel PNL to the display panel PNL.

Referring to FIGS. 2 and 3, the display panel PNL of the display device 1 according to the embodiment of FIG. 1 has a three-dimensional shape. In FIGS. 2 and 3, a direction parallel to a first side (horizontal side) of the display panel PNL is referred to as a first direction DR1, a direction parallel to a second side (vertical side) of the display panel PNL is referred to as a second direction DR2, and the thickness direction of the display panel PNL is referred to as a third direction DR3. As used herein, a direction may refer to two directions toward one side and the opposite side unless specifically stated otherwise. If it is necessary to discern between two opposite directions, the side in one of the two directions may be referred to as "one side in the direction", while the opposite side in the two directions may be referred to as "the opposite side in the direction." In FIG. 1, the side indicated by the arrow of a direction is referred to as one side in the direction, while the opposite side is referred to as the opposite side in the direction. The first direction DR1 to the third direction DR3 may be perpendicular to one another. It should be understood, however, that the present disclosure is not limited thereto. Referring to FIG. 3, the display panel PNL may displays images on one side of the display portion DS in the third direction DR3, and the bottom sensing portion SP may be disposed on the opposite side of the display portion DS in the third direction DR3.

The display panel PNL may be extended in the first direction DR1 and the second direction DR2. For example, the display panel PNL may be a stretchable display panel or a flexible display panel that can be switched between an unelongated state (hereinafter referred to as a first state) as shown in FIG. 2 and an elongated state (hereinafter referred to as a second state) elongated in the first direction DR1 and in the second direction DR2 by receiving an external force in the first direction DR1 and/or the second direction DR2.

As described above, the display panel PNL may include the display portion DS, the elongated portion ELG, and the sensor SN. As shown in FIG. 3, the display portion DS of the display panel PNL may be disposed on one side surface of the elongated portion ELG in the third direction DR3. In this instance, one surface of the elongated portion ELG in the third direction DR3 may be the upper surface on which display portion DS is disposed, and the opposite surface thereof in the third direction DR3 may be the lower surface on which the display portion DS is not disposed. The sensor SN may be disposed inside the elongated portion ELG.

The display portion DS may include island patterns 1100, slits SL, and connection patterns CNP to be described later. The island patterns 1100 of the display portion DS may display images to a user by emitting light upon receiving a control signal from the controller CTR. The island patterns 1100 may be attached on the upper surface of the elongated portion ELG by a pressure-sensitive adhesive, and may be spaced apart from one another with the slits SL therebetween. The slits SL may be spaces between the island patterns 1100. Accordingly, when viewed in the third direction DR3, the upper surface of the elongated portion ELG may be exposed by the slits SL. The slits SL may have a width W0 that varies depending on the operation of the display panel PNL. The width W0 of the slits SL may have, but is not limited to, approximately several μm.

The elongated portion ELG may be elongated according to the operation of the display panel PNL by including a stretchable polymer material such as polyurethane and polydimethylsiloxane. The structures of the elongated portion ELG and the sensor SN will be described later in detail.

When the display panel PNL is switched from the first state to the second state, the display portion DS, the elongated portion ELG and the sensor SN may be elongated according to the operation of the display panel PNL. For example, as the elongated portion ELG is elongated with the operation of the display panel PNL, the plurality of island patterns 1100 on the upper surface of the elongated portion ELG may move away from one another. Accordingly, the width W0 of the slits SL may increase as the elongated portion ELG is elongated. For example, when the display panel PNL is switched to the second state, the width W0 of the slits SL may increase toward the both sides in the first direction DR1 with reference to FIG. 3.

Hereinafter, the shape of the display portion DS and the structure of the display portion DS that change as the display panel PNL is switched from the first state to the second state will be described in detail.

Figure 6:
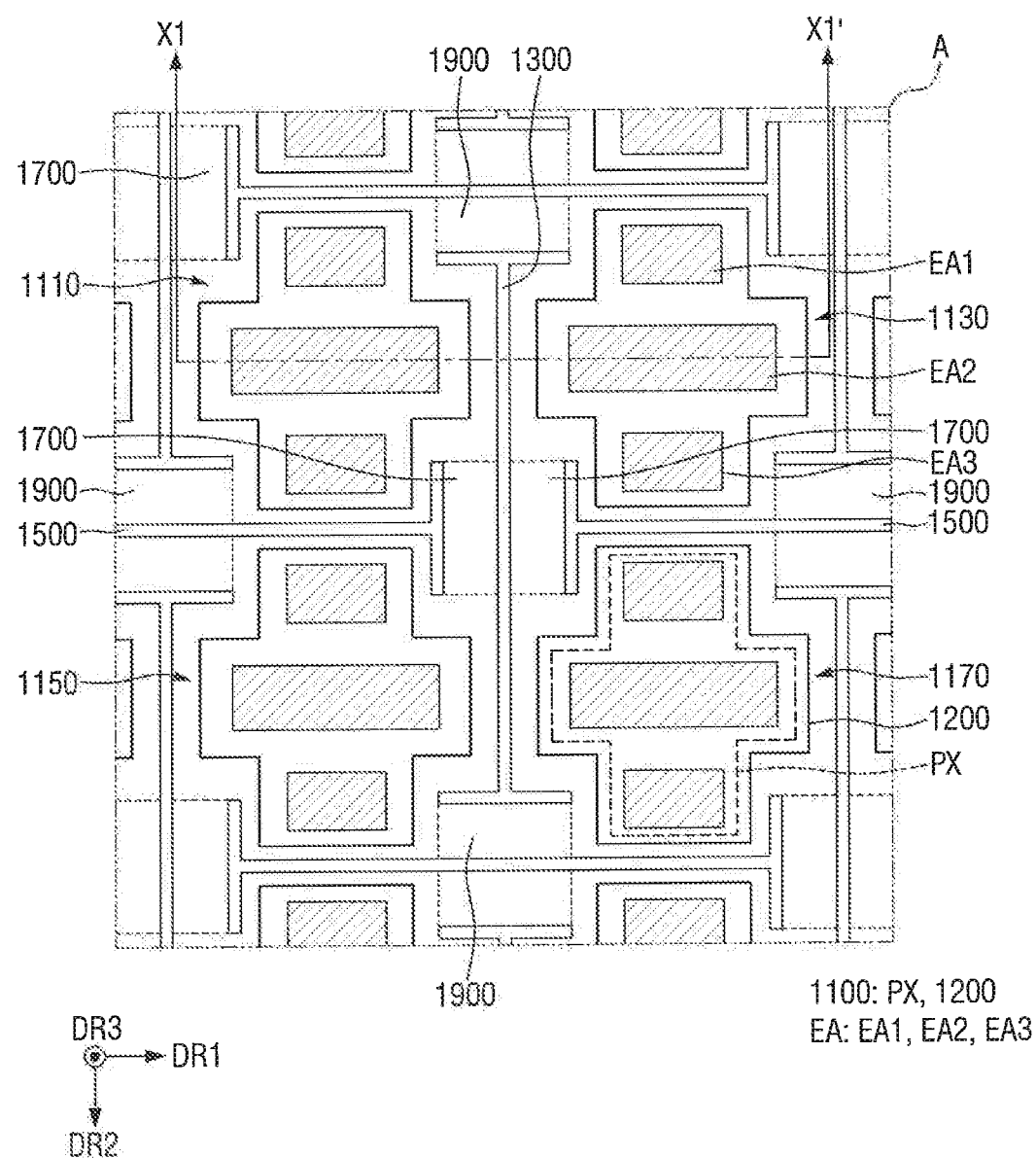
FIG. 6 is an enlarged view of area A of FIG. 4.
Figure 7:
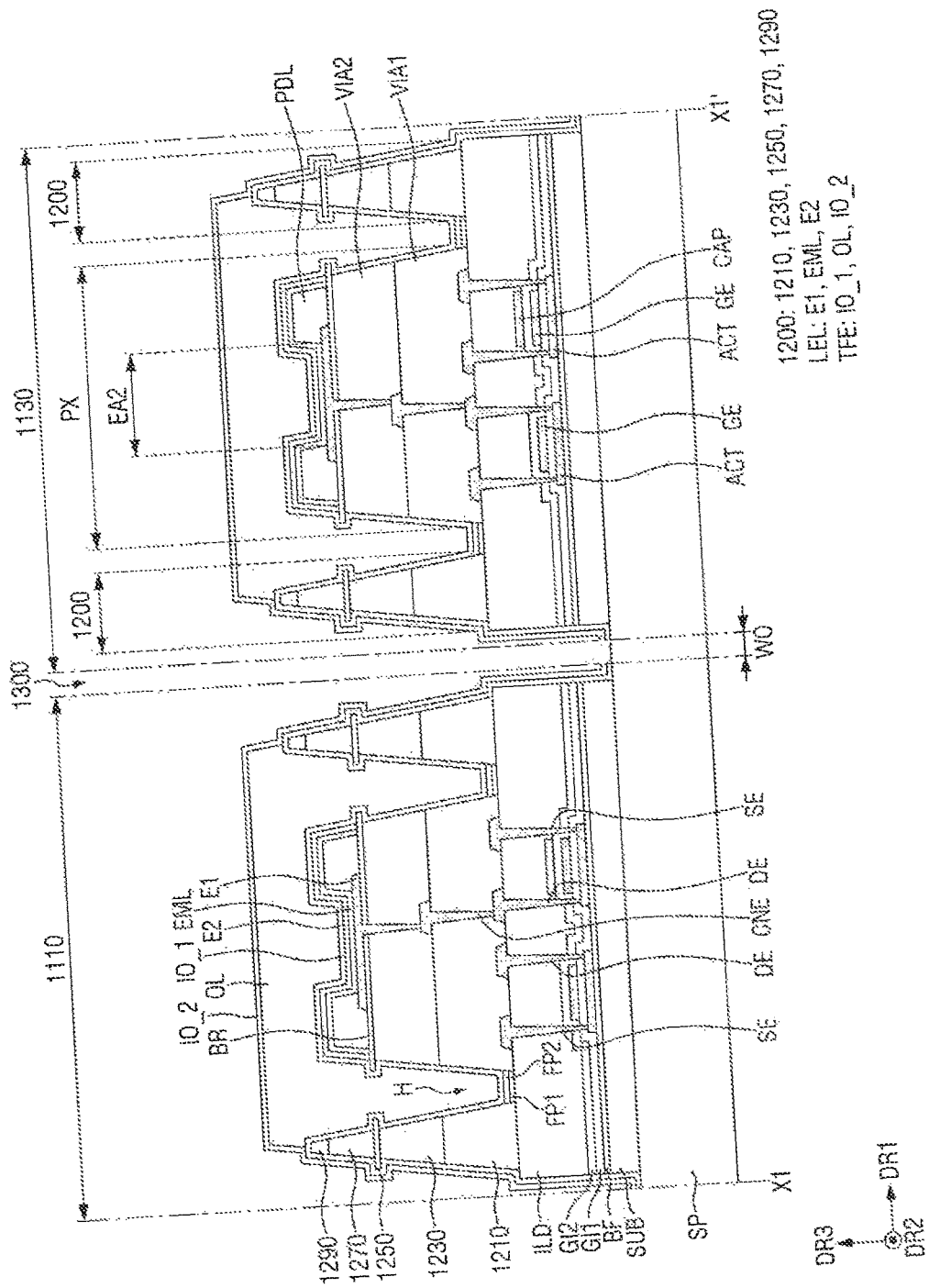
FIG. 7 is a cross-sectional view of island patterns, taken along line X1-X1' in FIG. 6.

FIG. 4 is an enlarged view of a part of the display portion of the display panel in the first state shown in FIG. 2. FIG. 5 is an enlarged view of a part of the display portion of the display panel in the second state shown in FIG. 2. FIG. 6 is an enlarged view of area A of FIG. 4. FIG. 7 is a cross-sectional view of the island patterns, taken along line X1-X1' in FIG. 6.

Referring to FIGS. 4 and 5, the display portion DS of the display panel PNL may include the island patterns 1100, the slits SL, and the connection patterns CNP as described above.

The island patterns 1100 may be disposed in a planar grid pattern on the upper surface of the sensor SN. The island patterns 1100 may be arranged in rows in the first direction DR1 and the second direction DR2. The island patterns 1100 may have, but is not limited to, a cross shape as shown in FIGS. 4 and 5. The island patterns 1100 may be partially spaced apart from one another and partially connected with one another. For example, the sides of each of the island patterns 1100 may be spaced apart from those of another one with the slits SL therebetween, while some of the vertices of each of the island patterns 1100 may be connected to those of another one by the connection patterns CNP.

The arrangement of the island patterns 1100 may change according to the operation of the display panel PNL. For example, in the first state, the island patterns 1100 may be arranged side by side in the first direction DR1 and the second direction DR2 with reference to FIG. 4, and in the second state, the island patterns 1100 may be arranged in a zigzag pattern in the first direction DR1 and the second direction DR2 with reference to FIG. 5.

The slits SL may space the island patterns 1100 apart. The slits SL may be formed by removing parts of the display portion DS with a laser. For example, the slits SL may be formed by removing the parts of the display portion DS with the laser, and the remaining parts may be the island patterns 1100 and the connection patterns CNP. The slits SL may be formed between the island patterns 1100.

The slits SL may include vertical slits 1300 and horizontal slits 1500. The vertical slits 1300 may be arranged side by side in the second direction DR2, and the horizontal slits 1500 may be arranged side by side in the first direction DR1. In other words, the vertical slits 1300 may be spaced apart from each other in the second direction DR2 and the horizontal slits 1500 may be spaced apart from each other in the first direction DR1. An imaginary line parallel to the first direction DR1 passing through the horizontal slit 1500 may pass through the center of the vertical slit 1300. An imaginary line parallel to the second direction DR2 passing through the vertical slit 1300 may pass through the center of the horizontal slit 1500.

In the first state, the width W0 of the slits SL may be constant. In the first state, the shape of the vertical slits 1300 includes the longer side extended in the second direction DR2 and the shorter side extended in the first direction DR1. The shorter sides may be disposed at the both ends of the longer sides in the second direction DR2 and may have a shape protruding toward the both sides in the first direction DR1. For example, the shape of the vertical slits 1300 may have, but is not limited to, the shape of an alphabetic capital letter I. In the first state, the shape of the horizontal slits 1500 may be identical to the shape of the vertical slits 1300 rotated clockwise by 90°. The horizontal slits 1500 may include the longer sides extended in the first direction DR1 and the shorter sides extended in the second direction DR2. The shorter sides may be disposed at the both ends of the longer sides in the first direction DR1, respectively, to protrude from the both sides in the second direction DR2. For example, the shape of the horizontal slits 1500 may have, but is not limited to, the shape of an alphabetic capital letter I rotated clockwise by 90°.

In the second state, the width W0 of the vertical slits 1300 and the horizontal slits 1500 may be elongated. In other words, the vertical slits 1300 and the horizontal slits 1500 may be expanded. For example, in the second state, the width W0 between the longer sides of the vertical slits 1300 is elongated toward both sides in the first direction DR1 such that it becomes larger toward the center of the vertical slits 1300. The width W0 between the longer sides of the horizontal slits 1500 is elongated toward both sides in the second direction DR2 such that it becomes larger toward the center of the horizontal slits 1500. In other words, center portions of the vertical and horizontal slits 1300 and 1500 are wider than end portions thereof near the short sides. This is because, as will be described later, the elongation ratio is the smallest where the elastic member is attached directly to the substrate SUB, and is greatest where it is not attached to the substrate SUB. Accordingly, in the second state, the island patterns 1100 may be arranged in a zigzag pattern as described above.

The connection patterns CNP may connect between the vertices of the adjacent island patterns 1100. The connection patterns CNP may be disposed at the vertices of the island patterns 1100 and the center of the slits SL. The connection patterns CNP may be extended from the vertices of the island patterns 1100. Lines for transmitting a control signal applied to the island patterns 1100 from the controller CTR may be disposed on the connection patterns CNP.

The connection patterns CNP may include vertical connection patterns 1700 and horizontal connection patterns 1900. The width of the vertical connection patterns 1700 in the second direction DR2 may be larger than the width thereof in the first direction DR1, and the width of the horizontal connection patterns 1900 in the second direction DR2 may be smaller than the width thereof in the first direction DR1. The vertical connection pattern 1700 and the horizontal connection pattern 1900 may have, but is not limited to, a rectangular shape when viewed from the top.

The shape of the connection patterns CNP may change according to the operation of the display panel PNL. For example, in the first state, the vertical connection pattern 1700 and the horizontal connection pattern 1900 may have a rectangular shape when viewed from the top, while in the second state, the central portion of the vertical connection pattern 1700 may be bent in the first direction DR1 and the central portion of the horizontal connection pattern 1900 may 1900 may be bent in the second direction DR2.

The separation or connection relationship between the plurality of island patterns 1100 will be described in detail with reference to FIG. 6. The island patterns 1100 may include a first island pattern 1110, a second island pattern 1130, a third island pattern 1150 and a fourth island pattern 1170. The ordinal numbers are given to the first to fourth island patterns 1110, 1130, 1150 and 1170 merely for the purpose of clearly distinguishing between them, and the first to fourth island patterns 1110, 1130, 1150 and 1170 are substantially identical to one another.

The horizontal connection pattern 1900 may be disposed at the vertex of the first island pattern 1110 on the side in the first direction DR1 and the opposite side in the second direction DR2. In other words, as shown in FIG. 6, the horizontal connection pattern 1900 may be disposed at an upper right side of the first island pattern 1110 and a lower left side of the first island pattern 1110. In this case, the horizontal connection pattern 1900 may be connected to the vertex of the second island pattern 1130 on the opposite side in the first direction DR1 and the vertex of another island pattern on the opposite side in the second direction DR2. The vertical connection pattern 1700 may be disposed at the vertex of the second island pattern 1130 on the opposite side in the first direction DR1 and the side in the second direction DR2. In other words, the vertical connection pattern 1700 may be disposed at an upper right side of the second island pattern 1130 and a lower left side of the second island pattern 1130. In this case, the second island pattern 1130 may be connected to the vertex of the fourth island pattern 1170 on the opposite side in the first direction DR1 and the vertex of another island pattern on the opposite side in the second direction DR2. The horizontal connection pattern 1900 may be disposed at the vertex of the fourth island pattern 1170 on the opposite side in the first direction DR1 and the side in the second direction DR2, so that it may be connected to the vertex of the third island pattern 1150 on the side in the first direction DR1 and the vertex of another island pattern on the side in the second direction DR2. The vertical connection pattern 1700 may be disposed at the vertex of the third island pattern 1150 on the side in the first direction DR1 and the opposite side in the second direction DR2, so that it may be connected to the vertex of the first island pattern 1110 on the side in the first direction DR1 and the vertex of another island pattern on the side in the second direction DR2. The above-described connection relationship may be repeated to form a grid pattern of the island patterns 1100.

Referring to FIGS. 6 and 7, the island pattern 1100 may include a pixel PX and a partition wall 1200 surrounding the pixel PX. The pixel PX may include emission areas EA. The partition wall 1200 may be disposed at the edge of each of the island patterns 1100. The pixel PX may be disposed at the center of each of the island patterns 1100. Although the partition wall 1200 has the cross shape in the example shown in FIG. 6, the present disclosure is not limited thereto. In addition, in the example shown in FIG. 6, the emission areas EA include a first emission area EA1, a second emission area EA2 and a third emission area EA3, and the second emission area EA2 is greater than the first emission area EA1 and the third emission area EA3.

The pixel PX of the island pattern 1100 may receive a control signal from the controller CTR to emit light. The pixel PX may include a substrate SUB, a buffer layer BF, a semiconductor pattern ACT, a first gate insulating layer GI1, a gate electrode GE, a second gate insulating layer GI2, a capacitor electrode CAP, an interlayer dielectric layer ILD, a source electrode SE, a drain electrode DE, a first via insulating layer VIA1, a connection electrode CNE, a second via insulating layer VIA2, a barrier layer BR, a pixel-defining film PDL, and a light-emitting element LEL.

The substrate SUB may serve as the base of the island patterns 1100. The substrate SUB may be a flexible substrate including a flexible polymer material such as polyimide. The substrate SUB may be attached directly to the upper surface of the bottom sensing portion SP by a pressure-sensitive adhesive. For example, the substrate SUB may be attached directly to the upper surface of a third elastic member 2500 to be described later through a pressure-sensitive adhesive. Accordingly, the elongation rate of the bottom sensing portion SP may be the smallest where it overlaps with the island patterns 1100 attached directly to the substrate SUB, and may be the largest where it overlaps with the slits SL where the substrate SUB is not attached.

The buffer layer BF can prevent the inorganic material for the substrate SUB from permeating into the semiconductor pattern ACT, which will be described later. The buffer layer BF may be disposed entirely on the substrate SUB. The semiconductor pattern ACT may be disposed on the buffer layer BF.

The first gate insulating layer GI1 may be disposed on the buffer layer BF on which the semiconductor pattern ACT is disposed, and may be disposed to have substantially the same thickness along the profile of the semiconductor pattern ACT. A gate electrode GE may be disposed on the first gate insulating layer GI1. The second gate insulating layer GI2 may be disposed to cover the gate electrode GE disposed on the first gate insulating layer GI1 and to have substantially the same thickness along the profile of the gate electrode GE.

The capacitor electrode CAP may be disposed on the second gate insulating layer GI2. The interlayer dielectric layer ILD may be disposed over the second gate insulating layer GI2 on which the capacitor electrode CAP is disposed to cover the capacitor electrode CAP sufficiently, thereby providing a substantially flat surface without creating level differences around the capacitor electrode CAP.

The source electrode SE and the drain electrode DE may be disposed on the interlayer dielectric layer ILD. The source electrode SE and the drain electrode DE may be electrically connected to the semiconductor pattern ACT through contact holes formed through the interlayer dielectric layer ILD, the second gate insulating layer GI2 and the first gate insulating layer GI1.

The first via insulating layer VIA1 may be disposed on the interlayer dielectric layer ILD, and the connection electrode CNE may be disposed on the first via insulating layer VIA1. The connection electrode CNE may be electrically connected to the drain electrode DE or the source electrode SE through a contact hole formed through the first via insulating layer VIA1.

The second via insulating layer VIA2 may be disposed on the first via insulating layer VIA1 on which the connection electrode CNE is disposed, and the barrier layer BR may be disposed on the second via insulating layer VIA2. The barrier layer BR may have substantially the same thickness along the profile of the second via insulating layer VIA2. The barrier layer BR may be disposed on the second via insulating layer VIA2 such that it protrudes from the both sides in the first direction DR1.

The light-emitting element LEL may be disposed on the barrier layer BR. The light-emitting element LEL may include a first electrode E1, an emission material layer EML, and a second electrode E2. The first electrode E1 may be an anode electrode, and the second electrode E2 may be a cathode electrode.

The pixel-defining film PDL may be disposed on both sides of the first electrode E1 of the light-emitting element LEL in the first direction DR1. The pixel-defining film PDL may define the emission areas EA of the island pattern 1100. In FIG. 7, the second emission area EA2 may be defined by the pixel-defining film PDL. The pixel-defining film PDL may partially expose the first electrode E1. The emission material layer EML may be disposed on the first electrode E1 on which the pixel-defining film PDL is disposed, and may be in direct contact with a part of the first electrode E1 exposed by the pixel-defining film PDL. The second electrode E2 may be disposed on the emission material layer EML. The second electrode E2 may be disposed to have substantially the same thickness along the profile of the emission material layer EML.

The substrate SUB, the buffer layer BF, the first gate insulating layer GI1, the second gate insulating layer GI2 and the interlayer dielectric layer ILD may be extended beyond the area where the pixel PX is disposed. In this instance, the partition wall 1200 of the island pattern 1100 may be disposed on the interlayer dielectric layer ILD where the pixel PX is not disposed.

The partition wall 1200 of the island pattern 1100 can define the boundary between the adjacent island patterns 1100 and can mitigate an external force applied to the pixel PX. The partition wall 1200 may be disposed on the above-described interlayer dielectric layer ILD to surround the pixel PX. The partition wall 1200 may include a first partition wall 1210, a second partition wall 1230, a third partition wall 1250, a fourth partition wall 1270, and a fifth partition wall 1290. The first partition wall 1210, the second partition wall 1230, the third partition wall 1250, the fourth partition wall 1270, and the fifth partition wall 1290 may be stacked in sequence.

The first partition wall 1210 may be substantially identical to the above-described first via insulating layer VIA1. The second partition wall 1230 may be substantially identical to the above-described second via insulating layer VIA2. The third partition wall 1250 may be substantially identical to the above-described barrier layer BR. The third partition wall 1250 may be disposed to protrude on the both sides in the first direction DR1 on the second partition wall 1230. The fourth partition wall 1270 may be substantially identical to the above-described pixel-defining film PDL. The fifth partition wall 1290 may be disposed on the fourth partition wall 1270 to prevent external pressure from being directly transmitted to the pixel PX.

Since the fifth partition wall 1290 is disposed on the fourth partition wall 1270, the width of the partition wall 1200 in the third direction DR3 may be substantially greater than the width of the pixel PX in the third direction DR3, but the present disclosure is not limited thereto. For example, the fifth partition wall 1290 may be eliminated.

The partition wall 1200 may be spaced apart from the pixel PX and disposed around the pixel PX. A hole H in the form of an undercut (a shape in which the size of the entrance is smaller than the size of the bottom) may be formed between the partition wall 1200 and the pixel PX. The hole H can prevent an organic layer OL of a thin-film encapsulation layer TFE from being delaminated, which will be described later. A first floating pattern FP1 and a second floating pattern FP2 may be disposed on the bottom of the hole H. The first floating pattern FP1 may be a residue formed via a process of forming the emission material layer EML in the pixel PX and may include substantially the same material as the emission material layer EML. The second floating pattern FP2 may be a residue formed via a process of forming the second electrode E2 in the pixel PX, and may include substantially the same material as the second electrode E2. The first floating pattern and the second floating pattern FP2 may not be formed if the width of the hole H is narrow.

The thin-film encapsulation layer TFE can protect a variety of elements in the island pattern 1100 from the outside and can define boundary of each of the island patterns 1100. The thin-film encapsulation layer TFE may be disposed on the pixel PX, the partition wall 1200, and the hole H. The thin-film encapsulation layer TFE may include a first inorganic layer IO_1, an organic layer OL, and a second inorganic layer IO_2.

The first inorganic layer IO_1 may be disposed on the pixel PX, the hole H and the partition wall 1200 to have substantially the same thickness along the profiles of the pixel PX, the hole H and the partition wall 1200. The first inorganic layer IO_1 may be extended beyond the profile of the partition wall 1200 to cover the edges of the interlayer dielectric layer ILD, the second gate insulating layer GI2, the first gate insulating layer GI1, the buffer layer BF, and the substrate SUB. Accordingly, the first inorganic layer IO_1 may entirely cover the boundary of the island pattern 1100. A part of the first inorganic layer IO_1 may be further disposed on the upper surface of the bottom sensing portion SP.

The organic layer OL may be disposed on the first inorganic layer IO_1 to cover the pixel PX and the hole H. A part of the organic layer OL may be disposed on the partition wall 1200, but may not be disposed beyond the partition wall 1200. The organic layer OL may be thickest in the hole H. As described above, since the hole H has the undercut shape, the organic layer OL may not be easily delaminated from the island pattern 1100.

The second inorganic layer IO_2 may be disposed over the first inorganic layer IO_1 on which the organic layer OL is disposed. The second inorganic layer IO_2 may have substantially the same thickness along the profiles of the organic layer OL and the first inorganic layer IO_1. The second inorganic layer IO_2 may be extended beyond the profile of the partition wall 1200 to cover the edges of the interlayer dielectric layer ILD, the second gate insulating layer GI2, the first gate insulating layer GI1, the buffer layer BF, and the substrate SUB. Accordingly, the second inorganic layer IO_2 may entirely cover the boundary of the island pattern 1100. As described above, the first inorganic layer IO_1 may be partially disposed on the upper surface of the bottom sensing portion SP, and the second inorganic layer IO_2 may be disposed along the profile of the first inorganic layer, and thus the second inorganic layer IO_2 may also be partially disposed on the upper surface of the bottom sensing portion SP. The organic layer OL may be disposed between the second inorganic layer IO_2 and the first inorganic layer IO_1, but the present disclosure is not limited thereto. For example, the organic layer OL may be disposed between the second inorganic layer IO_2 and the first inorganic layer IO_1 between the partition walls 1200, but the organic layer OL may not be disposed between the second inorganic layer IO_2 and the first inorganic layer IO_1 on the edges of the interlayer dielectric layer ILD, the second gate insulating layer GI2, the first gate insulating layer GI1, the buffer layer BF, and the substrate SUB.

The first inorganic layer IO_1 and the second inorganic layer IO_2 of an island pattern 1100 may be spaced apart from those of an adjacent island pattern 1100 with the slit SL therebetween. Accordingly, adjacent island patterns 1100 may be spaced apart from each other with the slit SL therebetween. The width W0 of the slit SL may refer to the distance between the first inorganic layer IO_1 and the second inorganic layer IO_2 of an island pattern 1100 and those of an adjacent island pattern 1100. In other words, the width W0 of the slit SL may refer to the width of the upper surface of the bottom sensing portion SP exposed between the first inorganic layer IO_1 and the second inorganic layer IO_2 of the island pattern 1100 and those of the adjacent island pattern 1100. In FIG. 7, the first inorganic layer IO_1 and the second inorganic layer IO_2 of the first island pattern 1110 may be spaced apart from the first inorganic layer IO_1 and the second inorganic layer IO_2 of the second island pattern 1130, with the vertical slit 1300 therebetween. Accordingly, the upper surface of the bottom sensing portion SP may be exposed by the slit SL.

Hereinafter, the structure of the bottom sensing portion SP will be described in detail.

Figure 8:
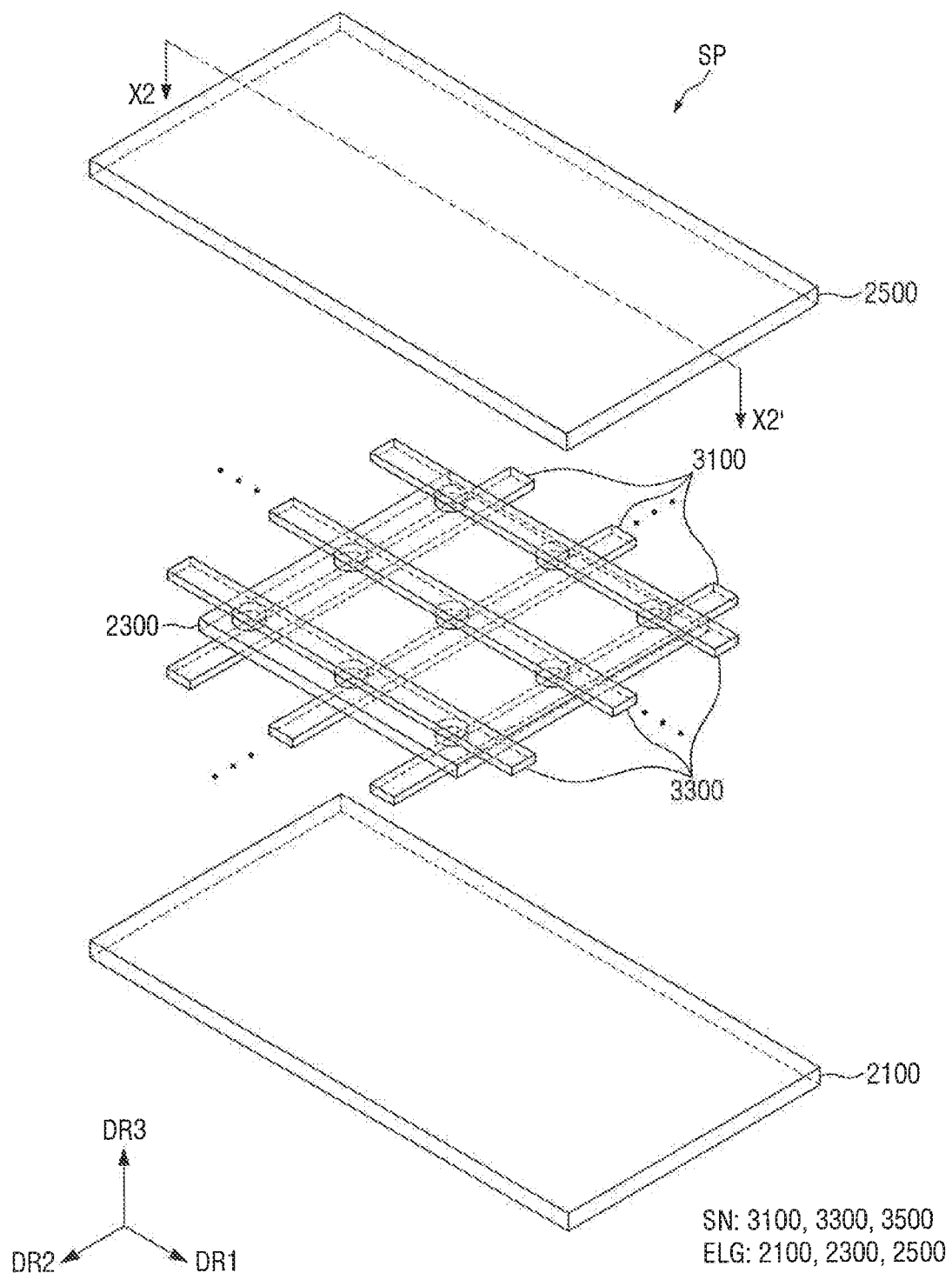
FIG. 8 is an exploded perspective view showing a structure of a lower sensing portion according to an embodiment of the present disclosure.
Figure 9:
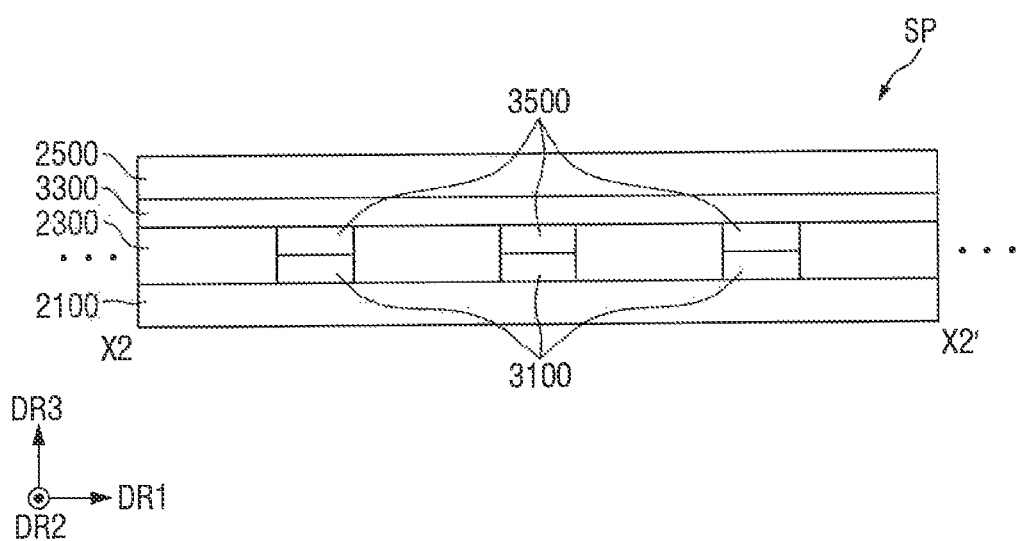
FIG. 9 is a cross-sectional view schematically showing a cross-section of the lower sensing portion according to an embodiment of the present disclosure.
Figure 10:
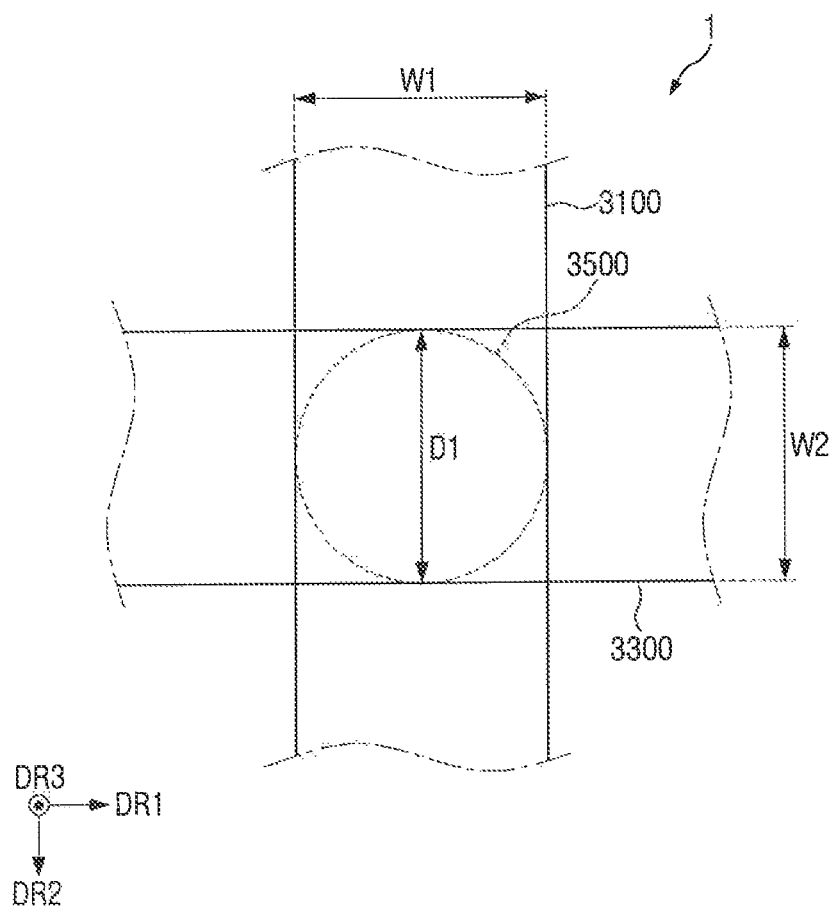
FIG. 10 is a plan view showing widths of a first sensing line and a second sensing line and a diameter of a sensing material layer according to an embodiment of the present disclosure.
Figure 11:
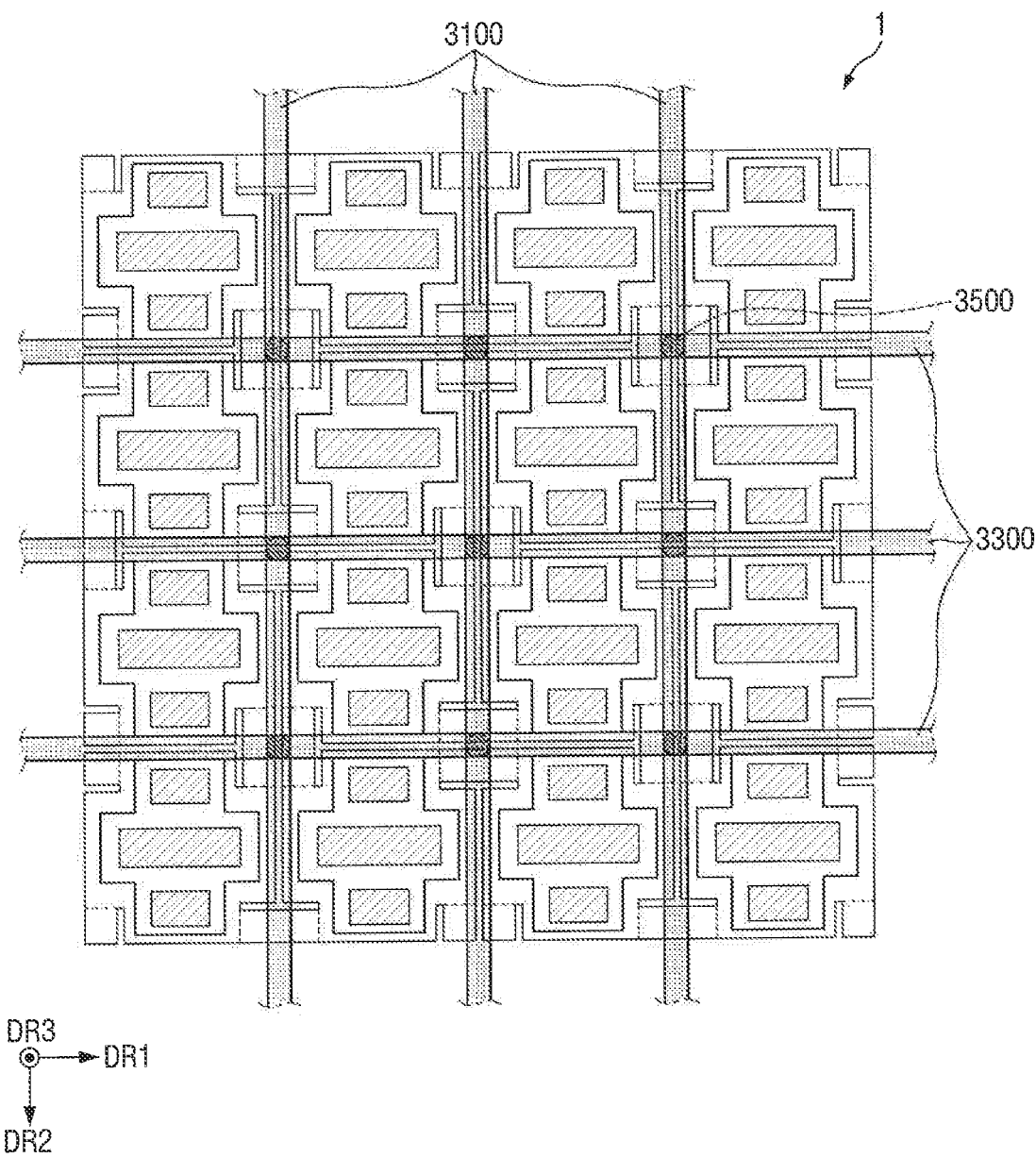
FIG. 11 is a plan view showing an arrangement relationship of a display portion and a sensor of a display panel in a first state according to an embodiment of the present disclosure.
Figure 12:
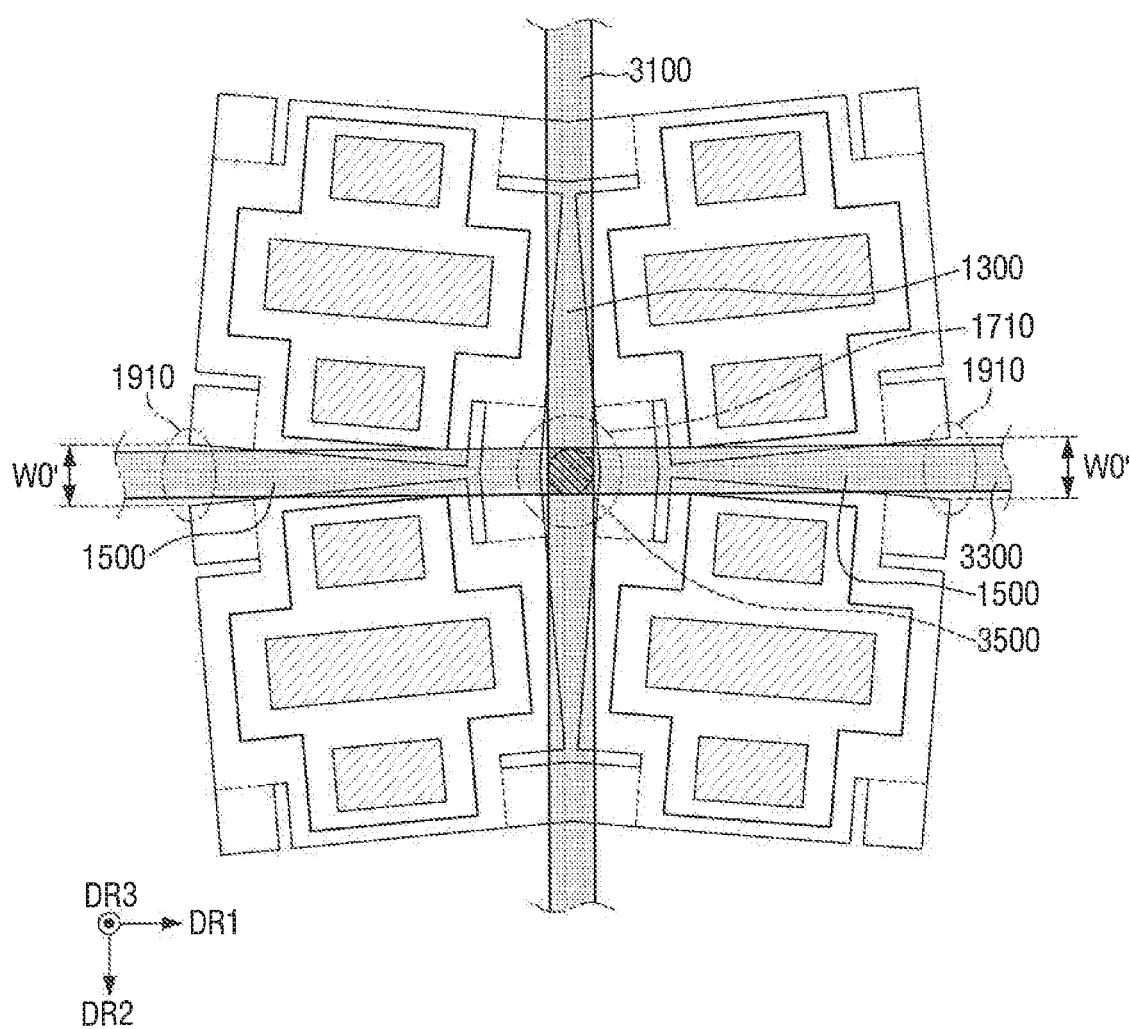
FIG. 12 is a plan view showing an arrangement relationship of the display portion and the sensor of the display panel in a second state according to an embodiment of the present disclosure.

FIG. 8 is an exploded perspective view showing a structure of a bottom sensing portion. FIG. 9 is a cross-sectional view schematically showing a cross-section of the bottom sensing portion. FIG. 10 is a plan view showing widths of a first sensing line and a second sensing line and a diameter of a sensing material layer. FIG. 11 is a plan view showing an arrangement relationship of a display portion and a sensor of a display panel in a first state. FIG. 12 is a plan view showing an arrangement relationship of the display portion and the sensor of the display panel in a second state.

Referring to FIG. 8, an elongated portion ELG may include a first elastic member 2100, a second elastic member 2300 and a third elastic member 2500. A sensor SN may include first sensing lines 3100, second sensing lines 3300, and sensing material layers 3500.

The elongated portion ELG may support the above-described display portion DS and may stretch the display portion DS as required by a user. The elongated portion ELG may include a polymer material having flexibility as described above. For example, the elongated portion ELG may include polyurethane, polydimethylsiloxane, etc. Accordingly, the elongated portion ELG may be elongated into various shapes by an external force.

The sensor SN may identify the position of an external stimulus sensed by the sensing material layers 3500 to be described later by using the first sensing lines 3100 and the second sensing lines 3300. The sensor SN may be disposed inside the elongated portion ELG.

The first sensing lines 3100 may be extended in the second direction DR2, and the second sensing lines 3300 may be extended in the first direction DR1. The first sensing lines 3100 may have the shorter sides in the first direction DR1 and the longer sides in the second direction DR2, and the second sensing lines 3300 may have the shorter side in the second direction DR2 and the longer sides in the first direction DR1.

The first sensing lines 3100 and the second sensing lines 3300 may include an electrically conductive and stretchable material. For example, the first sensing lines 3100 and the second sensing lines 3300 may include PEDOT:PSS (poly (3,4-ethyldioxy thiophene):poly(styrene sulfonate)), graphene, carbon nanotubes, metal nano wire, an organic/inorganic mixed electrode, a liquid metal, etc. Accordingly, when the first, second and third elastic members 2100, 2300 and 2500 are elongated, the first sensing lines 3100 may be elongated in the second direction DR2, and the second sensing lines 3300 may be elongated in the first direction DR1.

The first sensing lines 3100 and the second sensing lines 3300 may intersect each other, and may be spaced apart from each other in the third direction DR3 with the sensing material layers 3500 interposed therebetween. It should be noted that the first sensing lines 3100 and the second sensing lines 3300 may be in direct contact with the sensing material layers 3500 to be electrically connected with each other. The first sensing lines 3100 and the second sensing lines 3300 may be electrically connected to the controller CTR to transmit a sensing signal by an external stimulus sensed from the sensing material layers 3500 to the controller CTR.

The sensing material layers 3500 may sense an external stimulus. The sensing material layers 3500 may be disposed in the elastic members. The sensing material layers 3500 may be, but are not limited to, formed in a cylindrical shape having a circular cross-section with a predetermined diameter D1. In some embodiments of the present disclosure, the sensing material layers 3500 may be a material that has a variable resistance changed by an external stimulus, and the sensor SN may operate as a piezoresistive sensor. It should be understood, however, that the present disclosure is not limited thereto. In the following description, a piezoresistive sensor will be described as the sensor SN for convenience of illustration. The configuration of the sensing material layers 3500 will be described in more detail later.

Referring to FIG. 9, the sensor SN may have a structure in which the first sensing lines 3100 are disposed on the first elastic member 2100, the sensing material layers 3500 are disposed on the first sensing lines 3100, the second sensing lines 3300 are disposed on the sensing material layers 3500, the second elastic member 2300 is disposed in the space formed by the first elastic member 2100, the first sensing line 3100, the sensing material layers 3500 and the second sensing line the 3300, and the third elastic member 2500 is disposed on the second sensing line 3300.

One side of the first elastic member 2100 in the third direction DR3 may be the upper surface on which the first sensing lines 3100 and the second elastic member 2300 are disposed. The opposite side of the first elastic member 2100 in the third direction DR3 may be the lower surface on which the first sensing lines 3100 and the second elastic member 2300 are not disposed. The first sensing lines 3100 may be in direct contact with the upper surface of the first elastic member 2100. The first sensing lines 3100 may be disposed on the upper surface of the first elastic member 2100 such that they are spaced apart from each other at a predetermined distance in the first direction DR1. The second elastic member 2300 may be provided in the spaces formed between the first sensing lines 3100.

The sensing material layers 3500 may be disposed on the first sensing lines 3100. In this structure, one side of the first sensing lines 3100 in the third direction DR3 may be the upper surface on which the sensing material layers 3500 is disposed, and the opposite side thereof in the third direction DR3 may be the lower surface on which the sensing material layers 3500 is not disposed. The sensing material layers 3500 may be in direct contact with the upper surface of the first sensing lines 3100 to be electrically connected to the first sensing lines 3100.

The width of the sensing material layers 3500 in the first direction DR1 may be equal to the width of the first sensing lines 3100 in the first direction DR1 with reference to FIG. 9, but the present disclosure is not limited thereto. For example, the width of the sensing material layers 3500 in the first direction DR1 may be smaller than the width of the first sensing line 3100 in the first direction DR1. The sensing material layers 3500 are disposed on the first sensing lines 3100, respectively, and the width of the sensing material layers 3500 in the first direction DR1 is equal to or less than the width of the first sensing lines 3100 in the first direction DR1. Accordingly, the sensing material layers 3500 may be arranged such that they are spaced apart from one another in the first direction DR1 at a predetermined distance like the first sensing lines 3100. The second elastic member 2300 may be provided in the spaces formed between the sensing material layers 3500.

The second elastic member 2300 may be used to fill the space between the first sensing line 3100 and the sensing material layer 3500 disposed thereon and the adjacent first sensing line 3100 and the sensing material layer 3500 disposed thereon. Accordingly, the second elastic member 2300 may fix the side surfaces of the first sensing lines 3100 and the sensing material layers 3500. Accordingly, the sensing material layers 3500 disposed on the first sensing lines 3100 can be stably fixed by the second elastic member 2300, so that the sensing material layers 3500 are not delaminated from the first sensing lines 3100. As a result, it is possible to maintain the sensing sensitivity. The second elastic member 2300 may be in direct contact with the first sensing lines 3100 and the sensing material layers 3500 so that there is no space between them. It should be understood, however, that the present disclosure is not limited thereto.

The second sensing lines 3300 may be disposed on the second elastic member 2300 between the sensing material layers 3500. For example, the second elastic member 2300 may 2300 may be disposed in the space defined by the first elastic member 2100, the first sensing lines 3100, the sensing material layers 3500, and the second sensing lines 3300. In this structure, one side of the second sensing lines 3300 in the third direction DR3 may be the upper surface on which the sensing material layer 3500 are not disposed, and the opposite side thereof in the third direction DR3 may be the lower surface on which the sensing material layers 3500 are disposed. The sensing material layers 3500 may be in direct contact with the lower surface of the second sensing lines 3300 to be electrically connected to the second sensing lines 3300.

The third elastic member 2500 may be disposed on the upper surface of the second sensing lines 3300. In this structure, one side of the third elastic member 2500 in the third direction DR3 may be the upper surface on which the second sensing lines 3300 are not disposed but the substrate SUB of the island pattern 1100 is attached by a pressure-sensitive adhesive, and the opposite side thereof in the third direction DR3 may be the lower surface on which the second sensing lines 3300 are disposed. The second sensing lines 3300 may be in direct contact with the lower surface of the third elastic member 2500. The second sensing lines 3300 may be disposed on the lower surface of the third elastic member 2500 such that they are spaced apart from each other at a predetermined distance in the second direction DR2.

Referring to FIG. 10, the width of the first sensing lines 3100 in the first direction DR1 (hereinafter referred to as a first width W1) and the width of the second sensing lines 3300 in the second direction DR2 (hereinafter referred to as a second width W2) may be at least equal to the diameter D1 of the sensing material layers 3500. If the first width W1 of the first sensing lines 3100 and the second width W2 of the second sensing lines 3300 are smaller than the diameter D1 of the sensing material layers 3500, the first sensing lines 3100 and the second sensing lines 3300 may fail to receive a sensing signal transmitted from the sensing material layers 3500. Accordingly, the first width W1 of the first sensing lines 3100 and the second width W2 of the second sensing lines 3300 may be equal to or greater than the diameter D1 of the sensing material layers 3500. Although the sensing material layer 3500 has a circular shape when viewed from the top in the example shown in FIG. 10, the shape of the sensing material layer 3500 is not limited to the circular shape as long as the diameter D1 of the sensing material layer 3500 is equal to or less than the first width W1 of the first sensing line 3100 and the width W2 of the second sensing line 3300. In other words, the width of the sensing material layer 3500 measured in the first direction DR1 may be less than or equal to the first width W1, and the width of the sensing material layer 3500 measured in the second direction DR2 may be less than or equal to the second width W2.

Referring to FIGS. 11 and 12, when the display panel PNL is switched from the first state to the second state, as described above, in some embodiments of the present disclosure, the width W0 between the longer sides of the vertical slits 1300 is elongated toward the both sides in the first direction DR1 in the second state such that it becomes larger toward the center of the longer sides of the vertical slits 1300, while the width W0 between the longer sides of the horizontal slits 1500 is elongated toward the both sides in the second direction DR2 in the second state such that it becomes larger toward the center of the longer sides of the horizontal slits 1500. The center of each of the vertical slits 1300 and the horizontal slits 1500 may have, but is not limited to, a first maximum expanded portion 1710 and a second maximum expanded portion 1910 in which the largest external stimulus is sensed. For example, the first maximum expanded portion 1710 and the second maximum expanded portion 1910 may not be disposed at the center of the vertical slit 1300 and the horizontal slit 1500. In the following description, the first maximum expanded portion 1710 and the second maximum expanded portion 1910 are disposed at the center of the vertical slit 1300 and the horizontal slit 1500 for convenience of illustration.

The width W0 of the slit SL may have the largest width W0' at the first maximum expanded portion 1710 and the second maximum expanded portion 1910. As shown in FIG. 12, the first maximum expanded portion 1710 may be provided between adjacent vertical connection portions 1700 and the second maximum expanded portion 1910 may be provided between adjacent horizontal connection portions 1900. Accordingly, in some embodiments of the present disclosure, to increase the sensing sensitivity, the sensing material layers 3500 may be disposed at the first maximum expanded portion 1710 of the vertical slit 1300 and the second maximum expanded portion 1910 of the horizontal slit 1500, but the present disclosure is not limited thereto. For example, the sensing material layers 3500 may not be disposed at the first maximum expanded portion 1710 of the vertical slit 1300 and the second maximum expanded portion 1910 of the horizontal slit 1500. In the following description, the sensing material layers 3500 are disposed at the first maximum expanded portion 1710 of the vertical slit 1300 and the second maximum expanded portion 1910 of the horizontal slit 1500 for convenience of illustration.

As described above, the sensing material layer 3500 may be disposed at a position where the first sensing line 3100 and the second sensing line 3300 overlap each other. For example, the position where the first sensing line 3100 and the second sensing line 3300 overlap each other may be located at the center of each of the horizontal slit 1500 and the vertical slit 1300. In other words, the position where the first sensing line 3100 and the second sensing line 3300 overlap each other may be the intersection of an imaginary line parallel to the direction in which the horizontal slit 1500 is extended, e.g., the first direction DR1 and an imaginary line parallel to the direction in which the vertical slit 1300 is extended, e.g., the second direction DR2. In this instance, the position where the first sensing line 3100 and the second sensing line 3300 overlap each other may overlap with the first maximum expanded portion 1710 and the second maximum expanded portion 1910. Although the first sensing line 3100 is disposed to overlap the vertical slit 1300 of the display portion DS while and the second sensing line 3300 is disposed to overlap the horizontal slit 1500 of the display portion DS in the example shown in FIGS. 11 and 23, the arrangement of the first sensing line 3100 and the second sensing line 3300 is not limited thereto. Any other arrangement may be possible as long as the intersection of the first sensing line 3100 and the second sensing line 3300 is located at the center of the horizontal slit 1500 and the center of the vertical slit 1300, e.g., it overlaps with the first maximum expanded portion 1710 and the second maximum expanded portion 1910.

As the display panel PNL is switched from the first state to the second state, the sensing material layers 3500 may provide a sensing signal by an external stimulus to the first sensing lines 3100 and the second sensing lines 3300. Then, the first sensing lines 3100 may detect a position on the display panel PNL in the first direction DR1 at which the sensing signal is generated, and the second sensing lines 3300 may detect a position on the display panel PNL in the second direction DR2 at which the sensing signal is generated, to transmit the sensing signal to the controller CTR. The controller CTR may transmit a control signal for controlling the operation of the display panel PNL according to the sensing signal back to the display panel PNL.

As described above, in the display device 1 according to the embodiment of the present disclosure, the sensing material layers 3500 are disposed at the positions that overlap in the third direction DR3 with the center of the slits SL having the largest elongation ratio of the elongated portion ELG, so that the sensing sensitivity can be increased. In addition, by incorporating the sensing material layers 3500 into the display panel PNL, the volume of the display device 1 can be reduced and the design of the display device 1 can be made easily.

According to an embodiment of the present disclosure, the display device 1 includes: a first elastic member 2100; a display portion DS disposed on the first elastic member 2100; and a sensing material layer 3500 disposed between the first elastic member 2100 and the display portion DS, wherein the display portion DS includes a first island pattern 1110, a second island pattern 1130, and a slit 1300, wherein the first island pattern 1110 and the second island pattern 1130 are spaced apart from each other with the slit 1300 therebetween, and each of the first island pattern 1110 and the second island pattern 1130 comprises a pixel PX, and wherein the sensing material layer 3500 overlaps the slit 1300.

Hereinafter, other embodiments of the present disclosure will be described. In the following description, the same or similar elements may be denoted by the same or similar reference numerals, and redundant descriptions will be omitted or briefly described.

Figure 13:
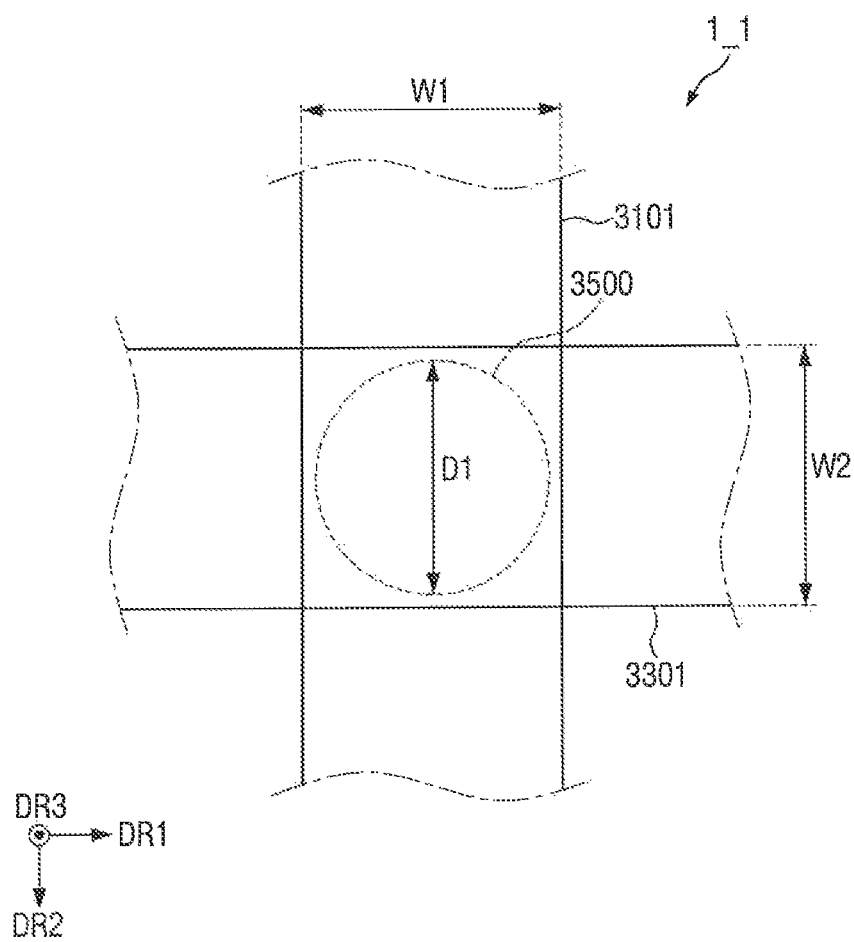
FIG. 13 is a plan view showing widths of a first sensing line and a second sensing line and a diameter of a sensing material layer in a display device according to another embodiment of the present disclosure.

FIG. 13 is a plan view showing widths of a first sensing line and a second sensing line and a diameter of a sensing material layer in a display device according to another embodiment of the present disclosure.

FIG. 13 illustrates the embodiment where a first width W1 of a first sensing line 3101 and a second width W2 of a second sensing line 3301 of a display device 1_1 may be greater than a diameter D1 of a sensing material layer 3500.

Figure 14:
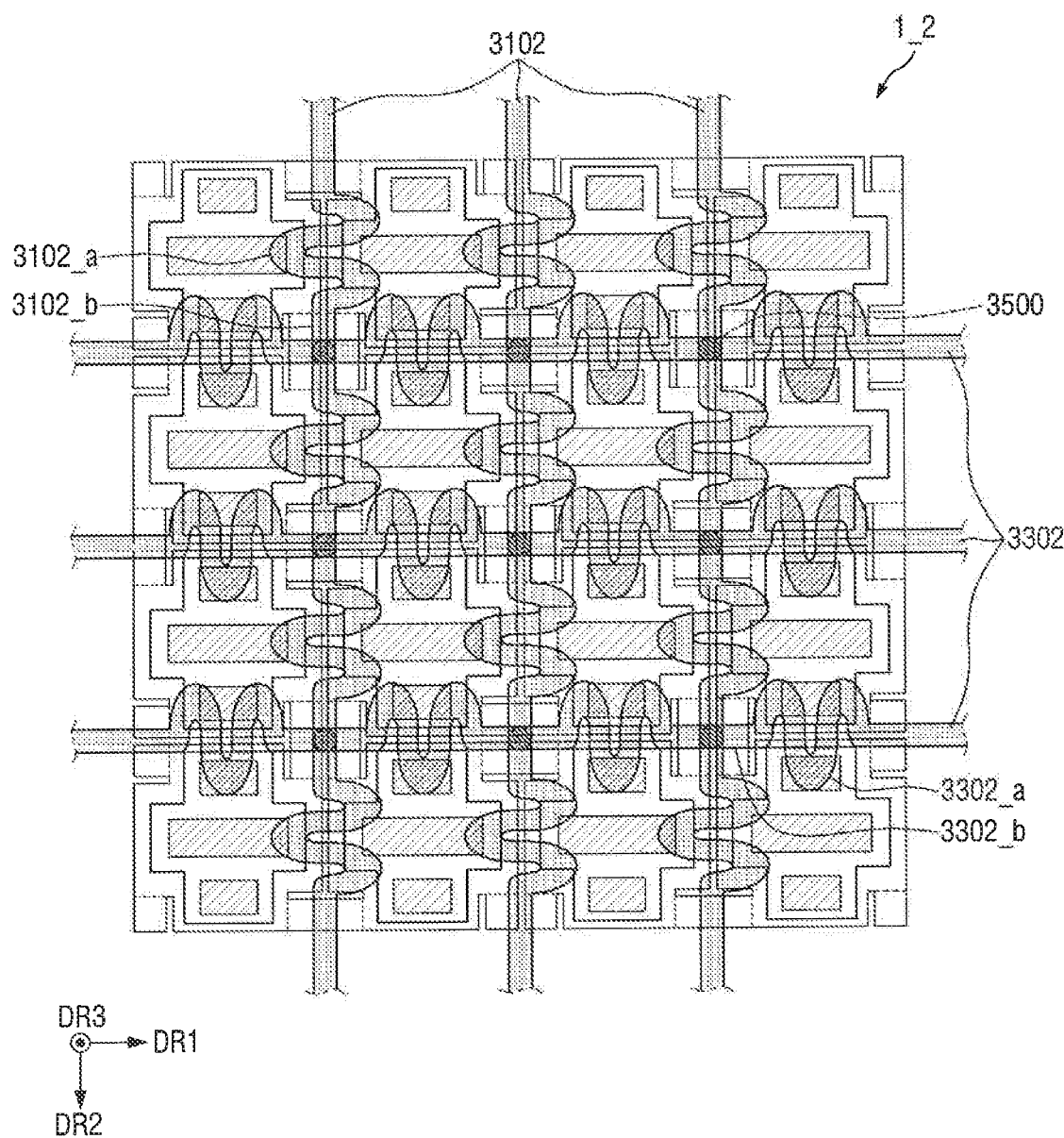
FIG. 14 is a plan view showing shapes of first sensing lines and second sensing lines of a display device according to another embodiment of the present disclosure in a first state.
Figure 15:
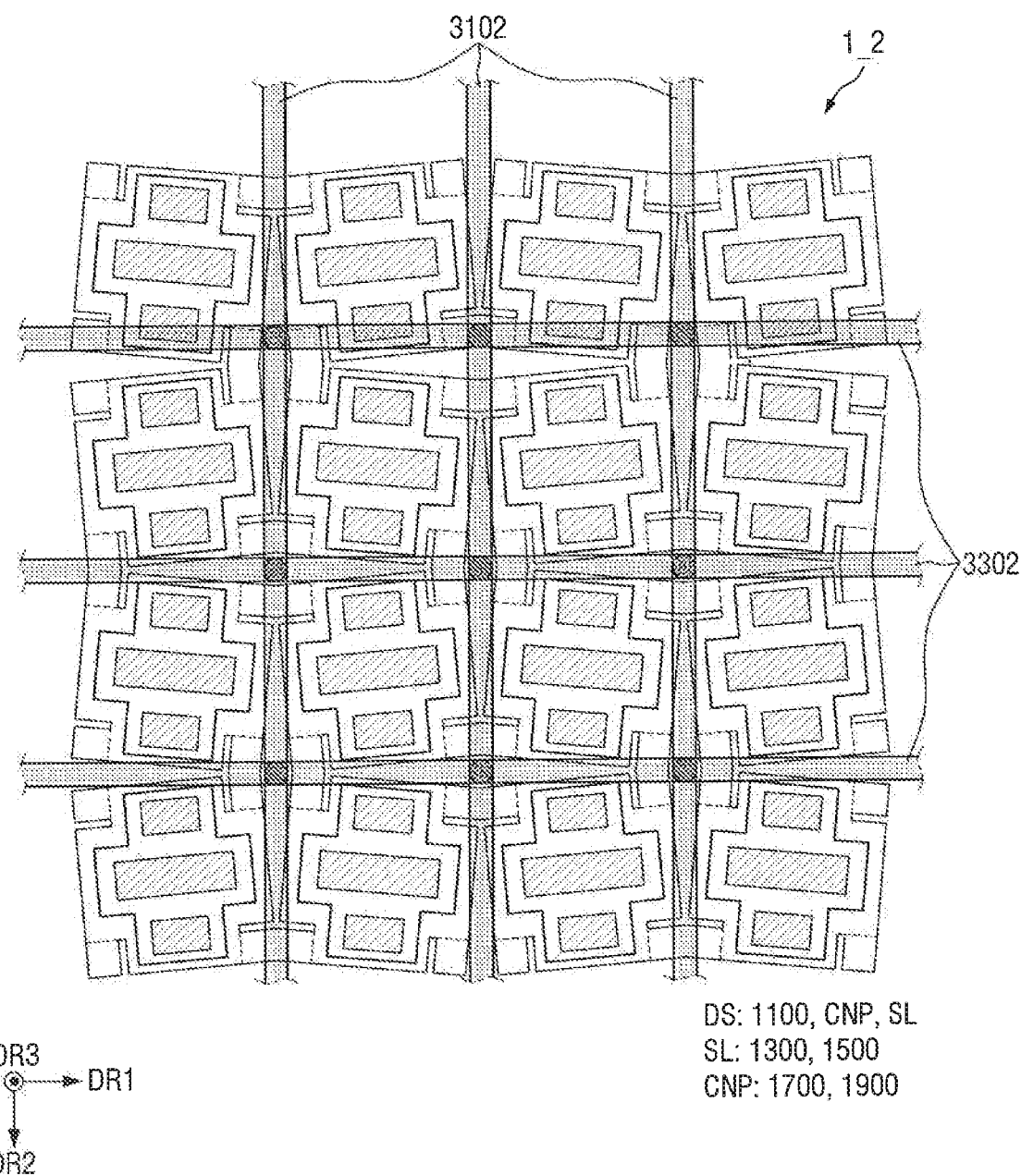
FIG. 15 is a plan view showing shapes of first sensing lines and second sensing lines of the display device according to the embodiment of FIG. 12 in a second state.

FIG. 14 is a plan view showing shapes of first sensing lines and second sensing lines of a display device according to another embodiment of the present disclosure in a first state. FIG. 15 is a plan view showing shapes of first sensing lines and second sensing lines of the display device according to the embodiment of FIG. 12 in a second state.

Referring to FIGS. 14 and 15, in the first state of a display device 1_2 according to this embodiment, each of first sensing lines 3102 may further include curved portions 3102_a and straight portions 3102_b, and each of second sensing lines 3302 may further include curved portions 3302_a and straight portions 3302_b.

In the first state, the curved portions 3102_a and the straight portions 3102_b of the first sensing lines 3100 are alternately arranged. The curved portions 3102_a may facilitate the stretching of the first sensing lines 3100 in the second state. The curved portions 3102_a are curved portions of the first sensing lines 3100, and may be bent in a curved shape as shown in FIG. 14, but the present disclosure is not limited thereto. The straight portions 3102_b may be disposed between the curved portions 3102_a and may pass through the positions where the sensing material layers 3500 are disposed. In other words, the straight portions 3102_b may be disposed near the center of the slits SL, while the curved portions 3102_a may be disposed in the other portions. For example, the straight portions 3102_b may overlap the sensing material layers 3500 and the curved portions 3102_a may not overlap the sensing material layers 3500. When the display panel PNL is switched from the first state to the second state, the curved portions 3102_a are straightened out into a straight line to facilitate the stretching of the first sensing lines 3100 as shown in FIG. 15.

In the first state, the curved portions 3302_a and the straight portions 3302_b of the second sensing lines 3300 are alternately arranged. The curved portions 3302_a may facilitate the stretching of the second sensing lines 3300 in the second state. The curved portions 3302_a are curved portions of the second sensing lines 3300, and may be bent in a curved shape as shown in FIG. 14, but the present disclosure is not limited thereto. The straight portions 3302_b may be disposed between the curved portions 3302_a and may pass through the positions where the sensing material layers 3500 are disposed. In other words, the straight portions 3302_b may be disposed near the center of the slits SL, while the curved portions 3302_a may be disposed in the other portions. For example, the straight portions 3302_b may overlap the sensing material layers 3500 and the curved portions 3302_a may not overlap the sensing material layers 3500. When the display panel PNL is switched from the first state to the second state, the curved portions 3302_a are straightened out into a straight line to facilitate the stretching of the second sensing lines 3300 as shown in FIG. 15.

Figure 16:
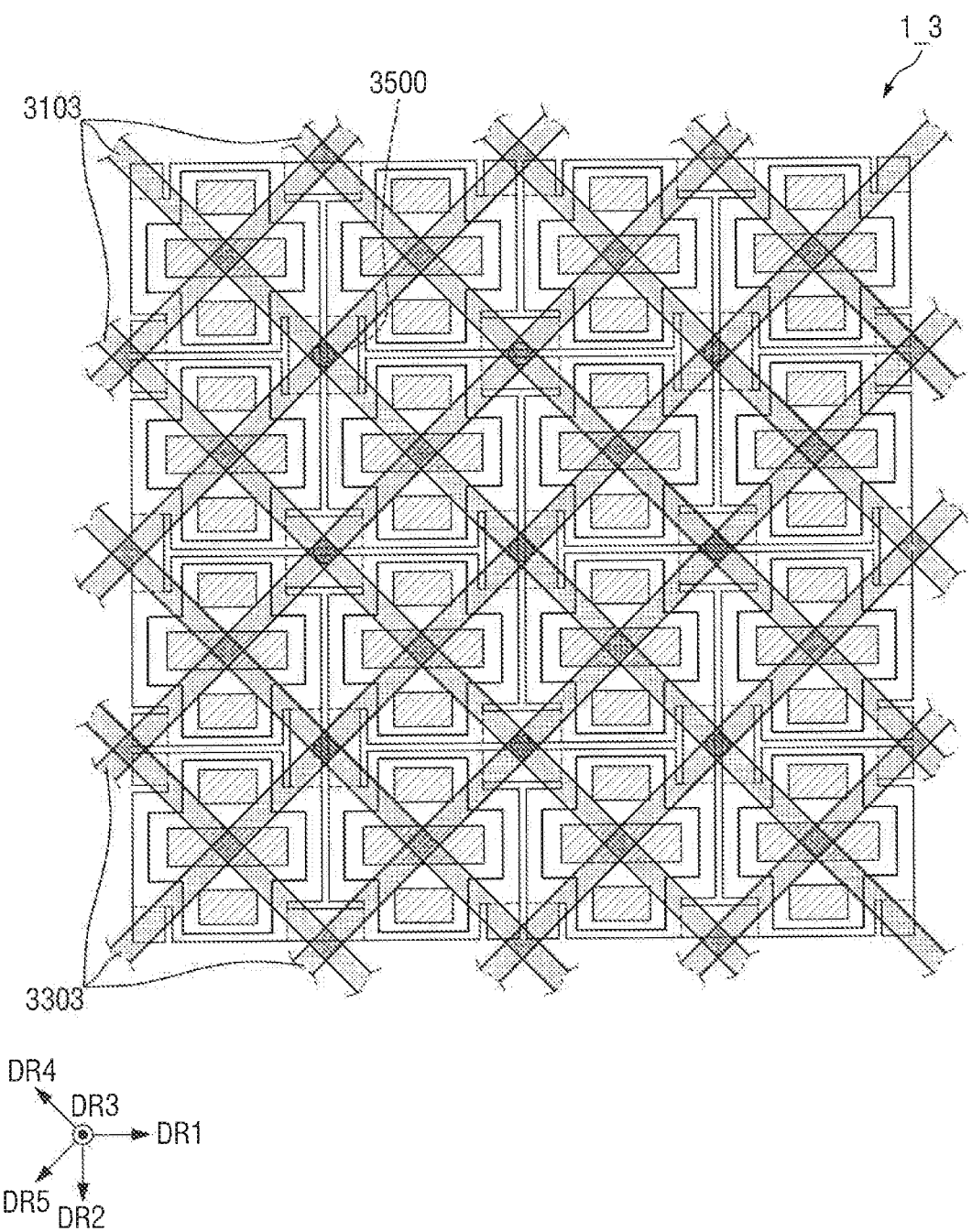
FIG. 16 is a plan view showing a layout of first sensing lines and second sensing lines of a display device according to yet another embodiment of the present disclosure.

FIG. 16 is a plan view showing a layout of first sensing lines and second sensing lines of a display device according to yet another embodiment of the present disclosure.

FIG. 16 illustrates an embodiment where first sensing lines 3103 and second sensing lines 3303 may be arranged as oblique lines in a display device 1_3.

For example, the first sensing lines 3103 may be extended in a fourth direction DR4 passing between the first direction DR1 and the second direction DR2, and the second sensing lines 3303 may be extended in a fifth direction DR5 passing between the first direction DR1 and the opposite direction to the second direction DR2. In this instance, the intersections of the first sensing lines 3103 and the second sensing lines 3303 may be formed not only at the center of the slits SL but also in the island patterns 1100. Accordingly, more sensing material layers 3500 can be disposed, and thus sensing sensitivity can be further refined.

Figure 17:
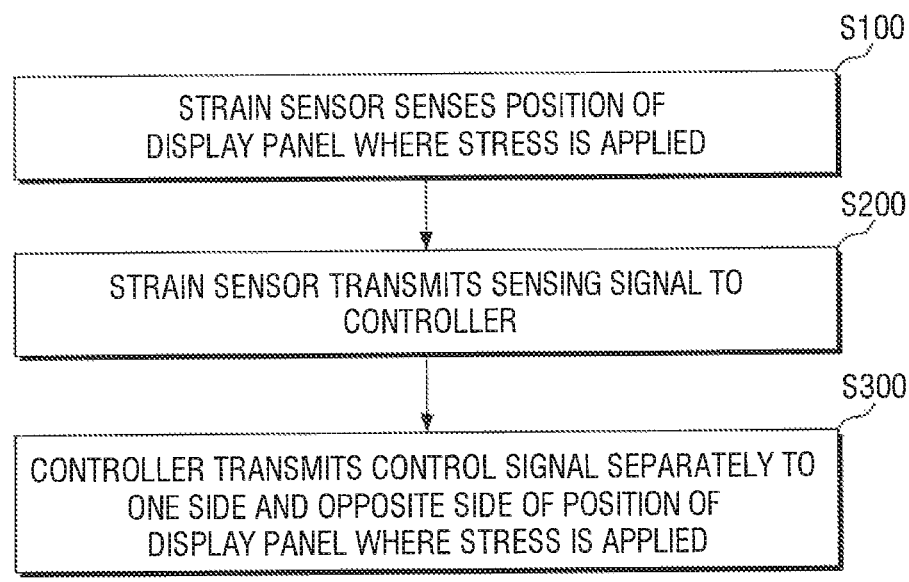
FIG. 17 is a flowchart for illustrating a method of controlling a display device according to yet another embodiment of the present disclosure.
Figure 18:
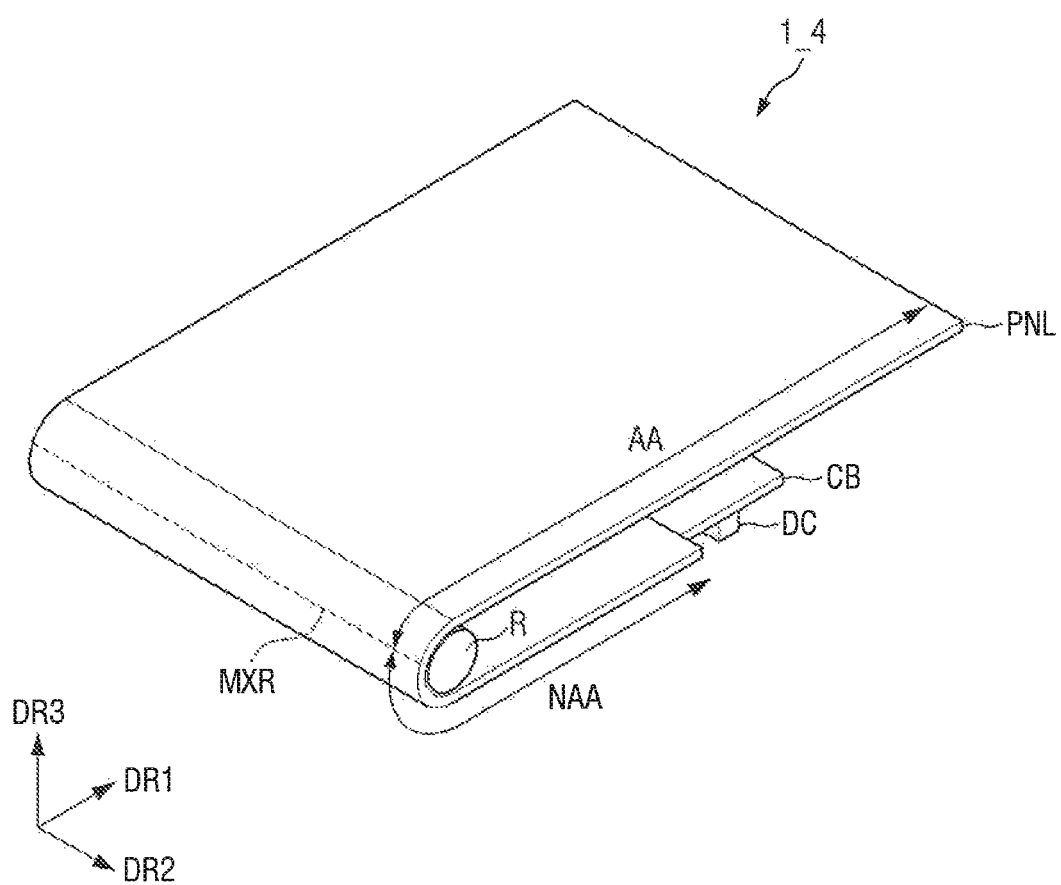
FIG. 18 is a perspective view showing an example of the display device according to the embodiment of FIG. 17.
Figure 19:
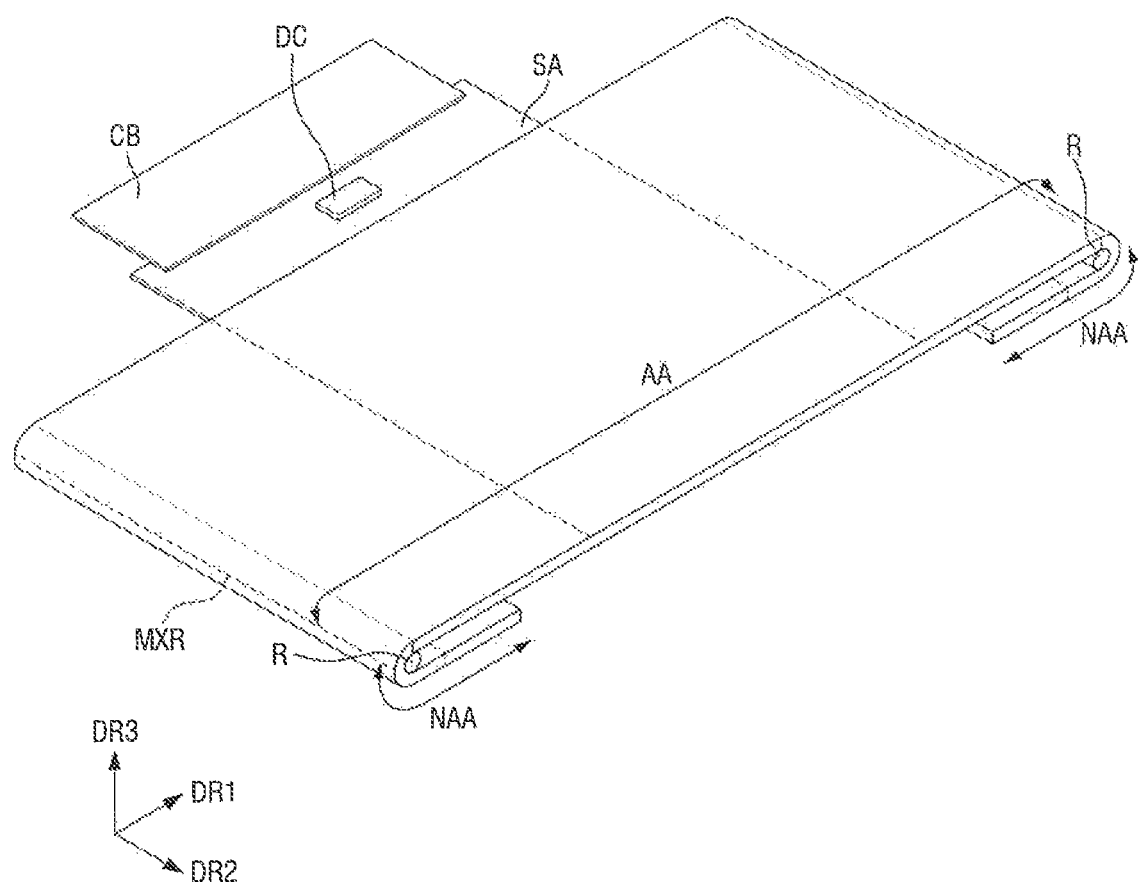
FIG. 19 is a perspective view showing an example of the display device according to the embodiment of FIG. 17.
Figure 20:
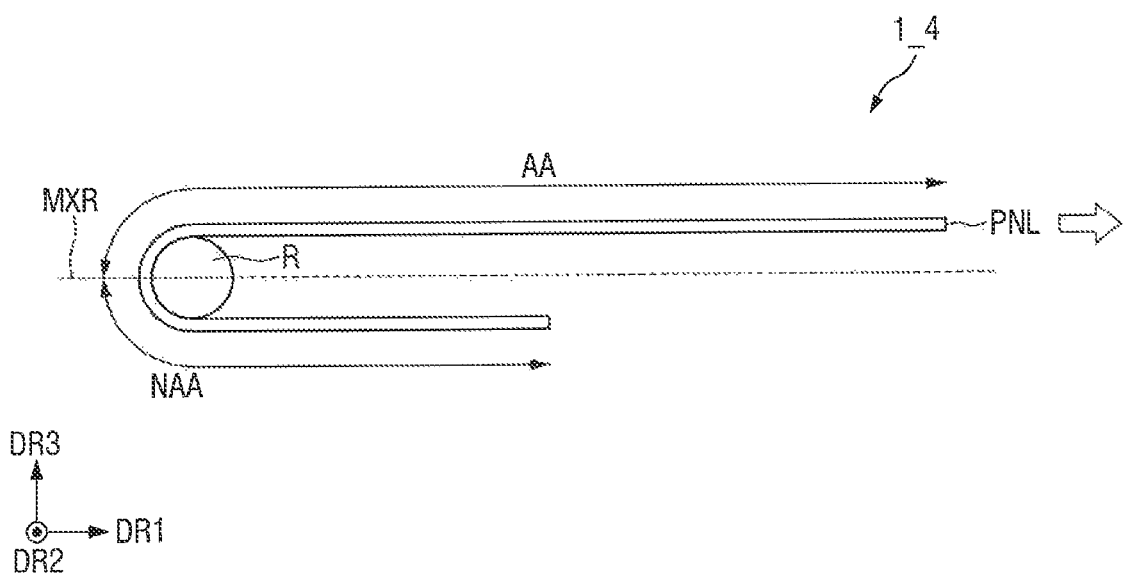
FIG. 20 is a cross-sectional view showing a cross section of the display device of FIG. 18.
Figure 21:
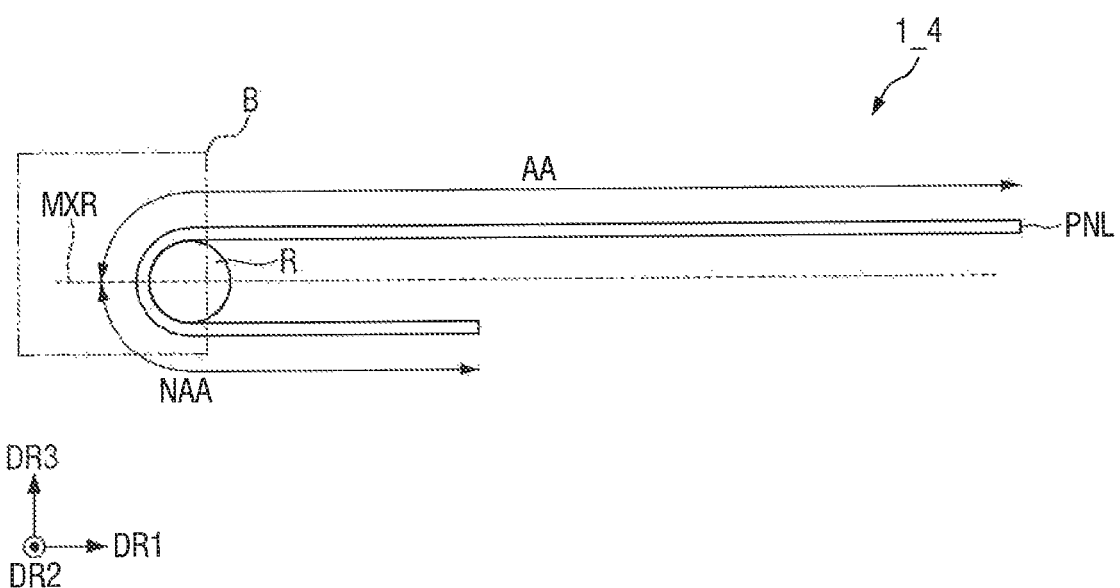
FIG. 21 is a cross-sectional view showing the display panel of FIG. 18 when its active area is elongated.
Figure 22:
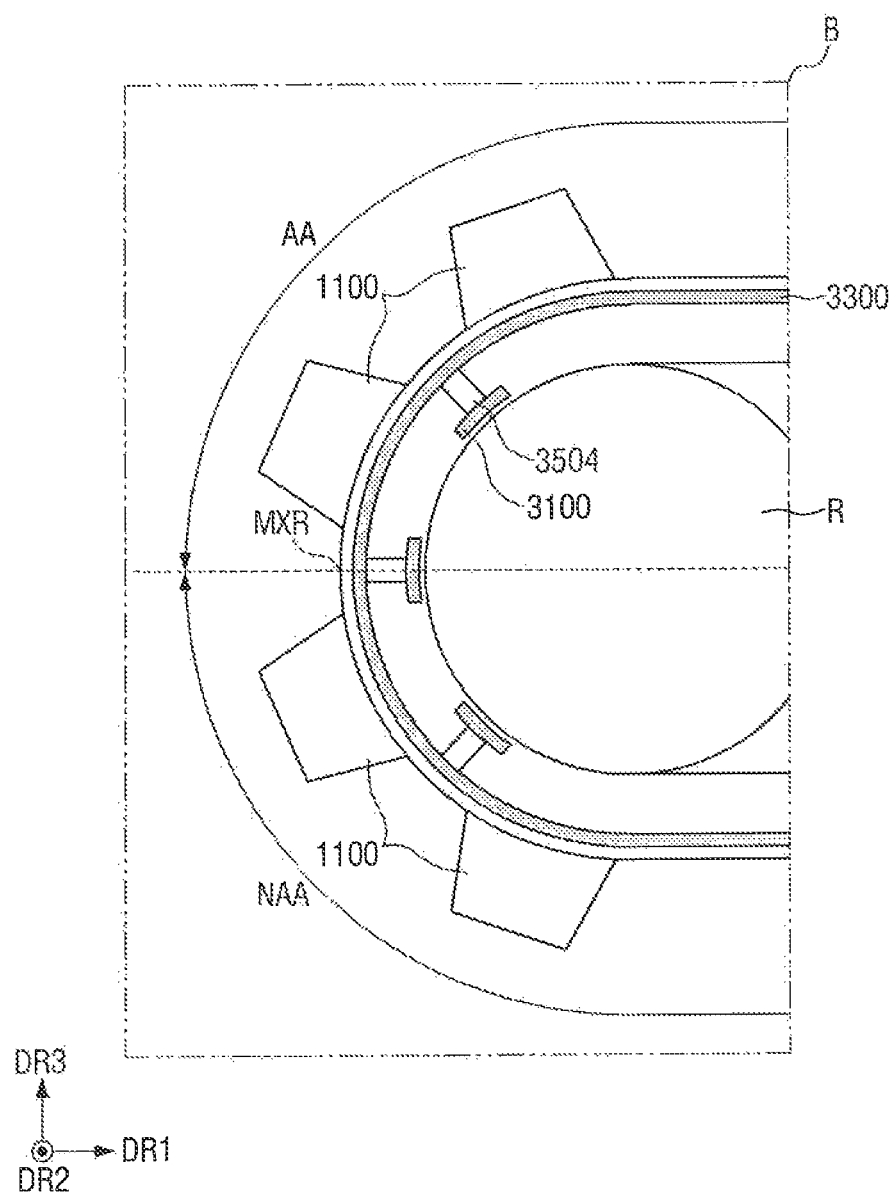
FIG. 22 is an enlarged view of area B of FIG. 21.
Figure 23:
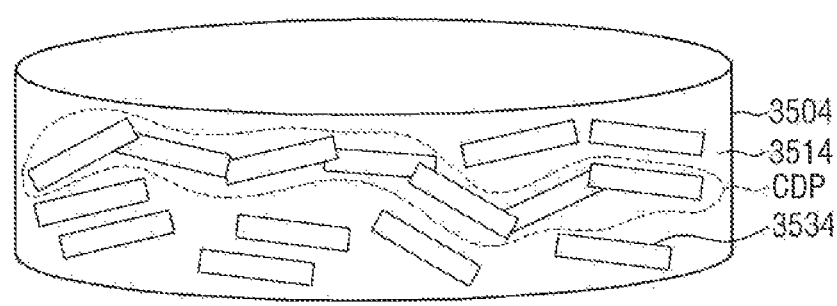
FIG. 23 is a perspective view showing an example of the structure of a strain sensing material layer of FIG. 17.
Figure 24:
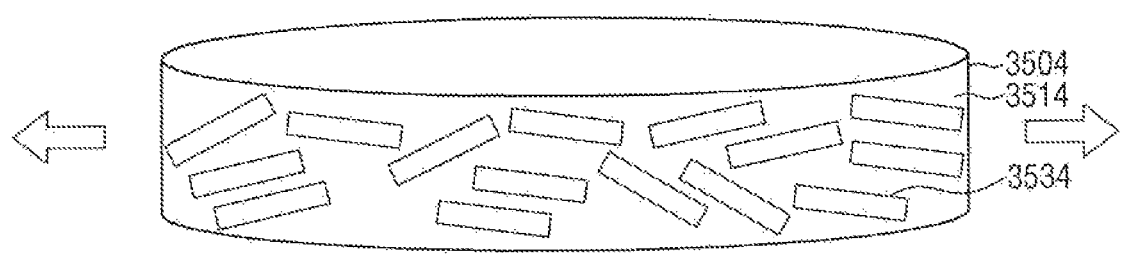
FIG. 24 is a perspective view showing the strain sensing material layer of FIG. 23 when it is elongated.

FIG. 17 is a flowchart for illustrating a method of controlling a display device according to yet another embodiment of the present disclosure. FIG. 18 is a perspective view showing an example of the display device according to the embodiment of FIG. 17. FIG. 19 is a perspective view showing an example of the display device according to the embodiment of FIG. 17. FIG. 20 is a cross-sectional view showing a cross section of the display device of FIG. 18. FIG. 21 is a cross-sectional view showing the display panel of FIG. 18 when the active area is elongated. FIG. 22 is an enlarged view of area B of FIG. 21. FIG. 23 is a perspective view showing an example of the structure of the strain sensing material layer of FIG. 17. FIG. 24 is a perspective view showing the strain sensing material layer of FIG. 23 when it is elongated.

Referring to FIGS. 17 to 24, a sensing material layer 3500 of a display device 1_4 according to the present embodiment may be a strain sensing material layer 3504 that senses the tensile stress of the display panel PNL. For example, when the display panel PNL is elongated and tensile stress is applied to the strain sensing material layer 3504, the resistance value of the strain sensing material layer 3504 changes, and the changed resistance value is sensed, so that the tensile stress can be sensed.

Referring to FIG. 17, the method of controlling a display device 1_4 according to the present embodiment may include sensing, by the strain sensing material layer 3504, a position of the display panel PNL where tensile stress is applied when the tensile stress is applied to the display panel PNL (step S100); transmitting, by the strain sensing material layer 3504, a sensing signal generated by the stress to the controller CTR (step S200); determining, by the controller CTR, the position of the display panel PNL based on the sensing signal transmitted from the strain sensing material layer 3504, and transmitting different control signals to one side and the opposite side of the position of the display panel PNL to operate the different areas of the display panel PNL differently (step S300).

Referring to FIG. 18, the display device 1_4 according to this embodiment may be, but is not limited to, a single slideable display device that can slide in one direction and includes a driver circuit DC and a circuit board CB at one end of the display panel PNL. For example, as shown in FIG. 19, the display device 1_4 according to this embodiment may be a multi-slidable display device that can slide in two directions, includes a subsidiary area SA at the center of the display panel PNL, and includes a driver circuit DC and a circuit board CB in the subsidiary area SA. It should be noted that the display device 1_4 according to this embodiment is not limited to a slidable display device. In the following description, a single slidable display device will be described as the display device 1_4 according to this embodiment for convenience of illustration.

Referring back to FIG. 18, the display panel PNL of the display device 1_4 may be operated such that an active area AA in which images are displayed and a non-active area NAA in which no image is displayed with reference to a maximum curvature region MXR are separately driven. In this instance, the operation signal may be a control signal for dividing between the active area AA and the non-active area NAA of the display panel PNL. The maximum curvature region MXR may be the largest curved portion among the curved portions of the display panel PNL. In other words, the maximum curvature region MXR may be a portion having the largest curvature value or a portion having the smallest radius of curvature among the portions of the display panel.

Referring to FIGS. 20 and 21, the display panel PNL of the display device 1_4 may 1_4 may engage with a roller R and may slide in the first direction DR1, but the present disclosure is not limited thereto. For example, the roller R may be eliminated depending on the operation method of the display device 1_4. When the roller R rotates clockwise, the active area AA of the display panel PNL is elongated in the first direction DR1 and the non-active area NAA may be reduced in the opposite direction to the first direction DR1.

Referring to FIG. 22, the display panel PNL may receive the maximum tensile stress at the maximum bending region MXR while it is sliding. Referring to FIG. 18, the maximum bending region MXR is where the display panel PNL and the roller R meet, and may be a line parallel to the second direction DR2. In this instance, the elastic members of the sensor SN of the display panel PNL near the maximum curvature region MXR are elongated in the second state, and accordingly, the strain sensing material layer 3504 disposed in the elastic members may be also elongated.

In some embodiments of the present disclosure, the strain sensing material layer 3504 may include a polymer layer made of a conductive polymer, such as polyvinylidene fluoride, and one selected from the group consisting of: metal nanoparticles, carbon nanotubes, graphene oxide and liquid metal as an additive for changing the resistance value when stress is applied. In the following description, the strain sensing material layer 3504 includes a polymer layer 3514 containing polyvinylidene fluoride and carbon nanotubes 3534 as an additive, for convenience of illustration.

Referring to FIGS. 23 and 24, the strain sensing material layer 3504 of the display device 1_4 of FIG. 18 may include the polymer layer 3514 containing polyvinylidene fluoride and the carbon nanotubes 3534 as an additive. The carbon nanotubes 3534 are conductive materials. In the first state, the carbon nanotubes 3534 may be connected with one another in the strain sensing material layer 3504 to form conductive paths CDP to lower the electrical resistance, as shown in FIG. 23. As shown in FIG. 24, as the display panel PNL is switched from the first state to the second state, the strain sensing material layer 3504 may be elongated to the left and right as shown in FIG. 24. When this happens, the distance between the carbon nanotubes 3534 may be further increased compared to that in the first state, and thus the connection between the carbon nanotubes 3534 may be broken and the conductive paths CDP may collapse. In other words, the conductive paths CDP may not be present in the strain sensing material layer 3504 of FIG. 24. As a result, the resistance value of the sensing material layer 3500 may increase. It should be noted that the carbon nanotubes 3534 are added as an additive in this instance, and thus a change in the resistance value of the sensing material layer 3500 may vary depending on the type of the additive. For example, when the stress sensing material layer 3500 is elongated, the resistance value of the stress sensing material layer 3500 may even increase depending on the type of additive.

If the connection between the carbon nanotubes 3534 is broken and the conductive paths CDP collapse, so that the resistance value of the sensing material layer 3500 increases, the current value flowing through the sensing material layer 3500 decreases. The sensing material layer 3500 may sense the current flowing therethrough and may transmit a sensing signal to the controller CTR through the first sensing lines 3100 and the second sensing lines 3300. The controller CTR may analyze the sensing signal from the sensing material layers 3500 to determine the position of the maximum bending region MXR. The controller CTR transmits the driving signal to one side of the maximum bending region MXR of the display panel PNL and does not transmit the driving signal to the opposite side of the maximum bending region MXR of the display panel PNL, so that the active area AA and the non-active area NAA of the display panel PNL can be driven individually. In this manner, the non-active area NAA of the display device 1_4 according to this embodiment is not driven, and thus it is possible to save power consumption.

Figure 25:
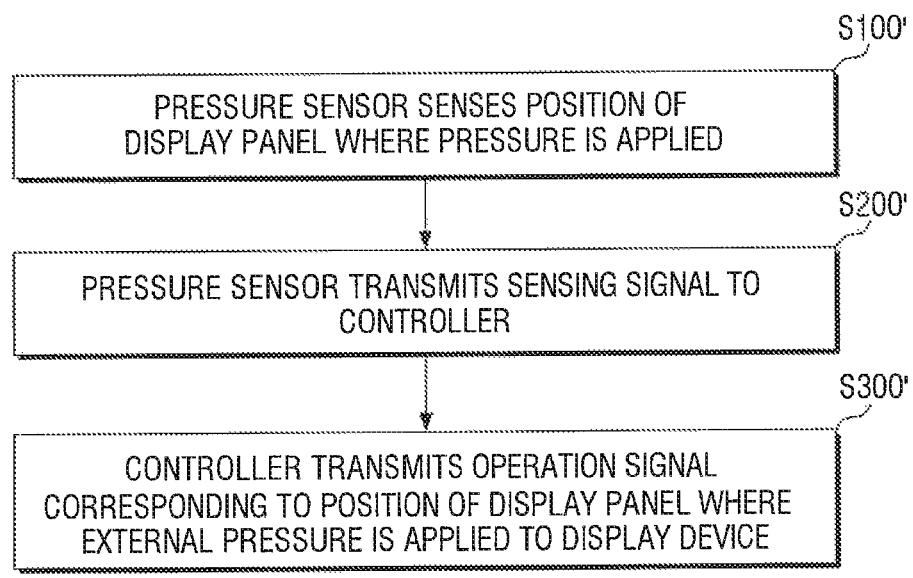
FIG. 25 is a flowchart for illustrating a method of controlling a display device according to yet another embodiment of the present disclosure.
Figure 26:
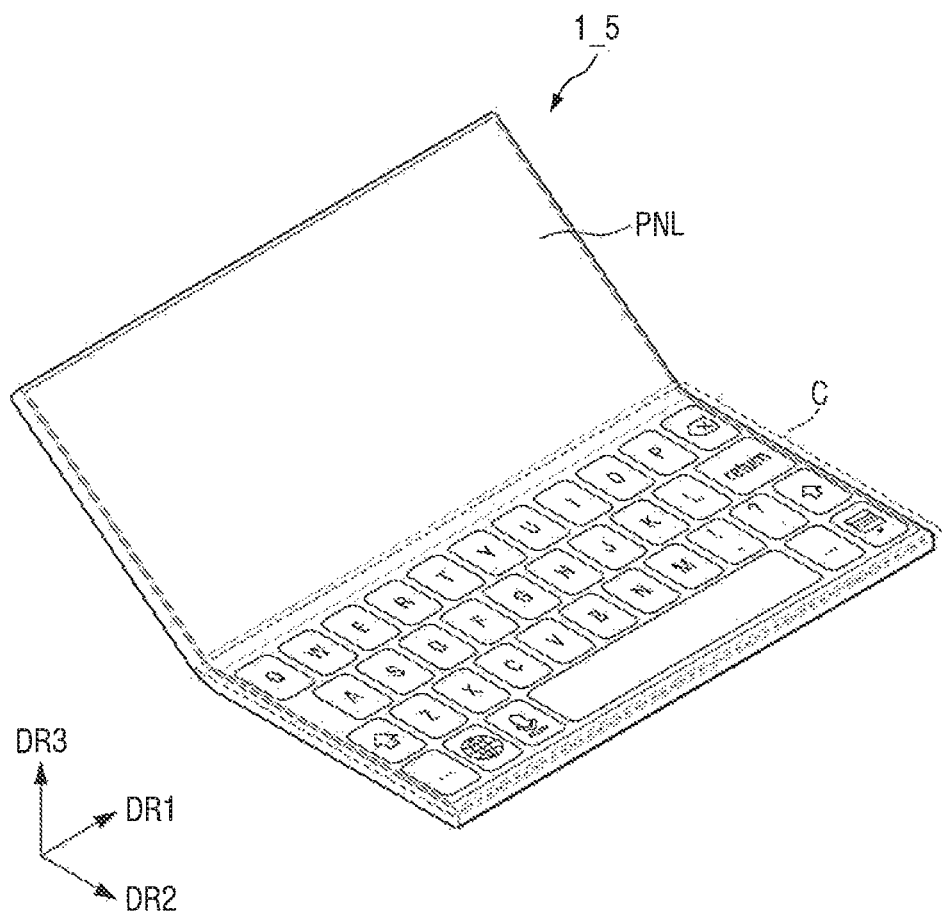
FIG. 26 is a perspective view showing an example of the display device according to the embodiment of FIG. 25.
Figure 27:
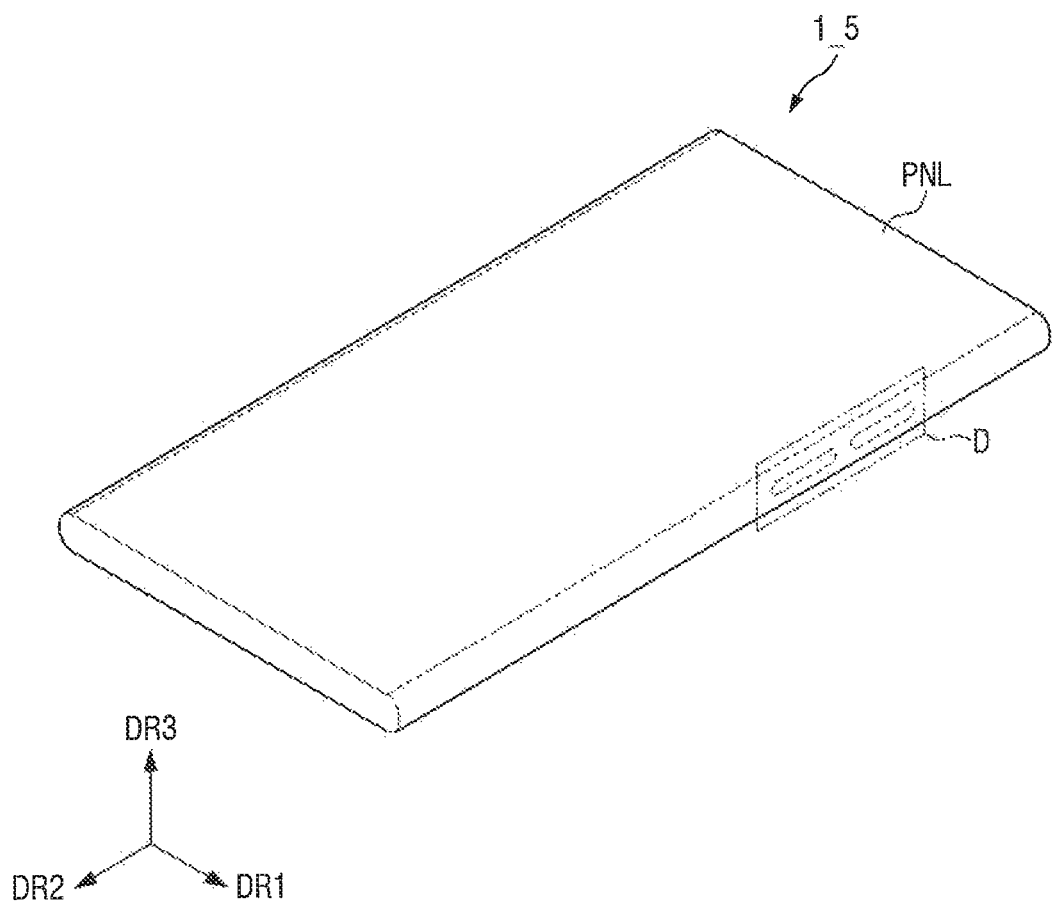
FIG. 27 is a perspective view showing an example of the display device according to the embodiment of FIG. 25.
Figure 28:
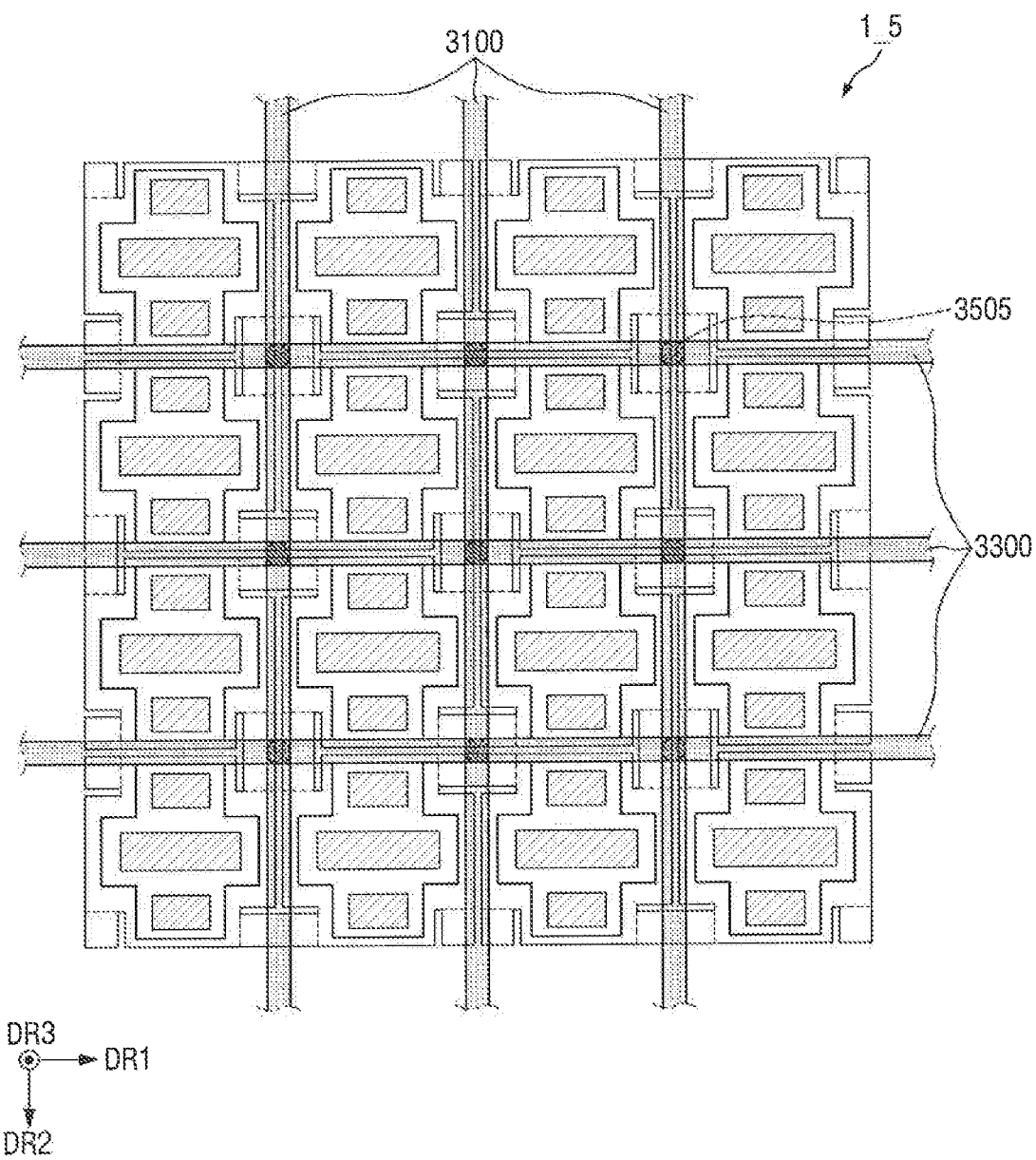
FIG. 28 is a plan view showing an arrangement of first and second sensing lines in area C of FIG. 26 and area D of FIG. 27.
Figure 29:
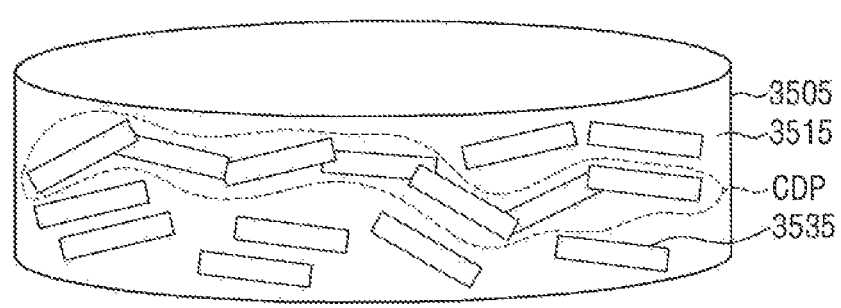
FIG. 29 is a perspective view showing an example of the structure of a pressure sensing material layer of the display device according to the embodiment of FIG. 25.
Figure 30:
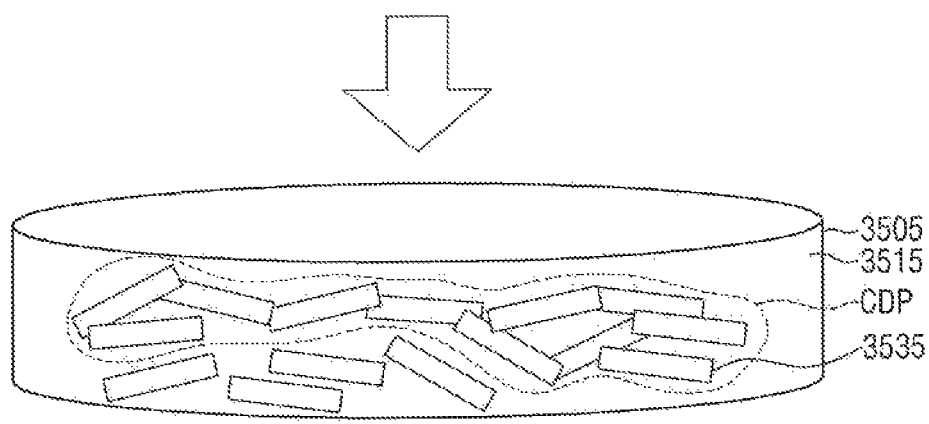
FIG. 30 is a perspective view showing the pressure sensing material layer of FIG. 26 when it receives external pressure.

FIG. 25 is a flowchart for illustrating a method of controlling a display device according to yet another embodiment of the present disclosure. FIG. 26 is a perspective view showing an example of the display device according to the embodiment of FIG. 25. FIG. 27 is a perspective view showing an example of the display device according to the embodiment of FIG. 25. FIG. 28 is a plan view showing an arrangement of first and second sensing lines in area C of FIG. 26 and area D of FIG. 27. FIG. 29 is a perspective view showing an example of the structure of a pressure sensing material layer of the display device according to the embodiment of FIG. 25. FIG. 30 is a perspective view showing the pressure sensing material layer of FIG. 26 when it receives external pressure.

Referring to FIGS. 25 to 30, a sensing material layer 3500 of a display device 15 according to the embodiment may be a pressure sensing material layer 3505 that senses a pressure applied to a display panel PNL. For example, when the display panel PNL receives pressure, the pressure sensing material layer 3505 may be compressed with the display panel PNL. When the pressure sensing material layer 3505 is compressed, the resistance value of the pressure sensing material layer 3505 is changed, so that the pressure can be sensed by sensing the changed resistance value.

Referring to FIG. 25, the method of controlling the display device 15 according to the present embodiment may include sensing, by the pressure sensing material layer 3505, a position of the display panel PNL where external pressure is applied when the pressure stress is applied to the display panel PNL (step S100'); transmitting, by the pressure sensing material layer 3505, a sensing signal generated by the pressure to the controller CTR (step S200'); and determining, by the controller CTR, the position of the display panel PNL based on the sensing signal transmitted from the pressure sensing material layer 3505, and transmitting an operation signal corresponding thereto to the display device 15 (step S300').

Referring to FIG. 26, as an example of the display device 15 according to this embodiment, it may include a keyboard input area indicated by area C. In this instance, the operation signal may be a keyboard input signal that allows a user to input characters of the keyboard by applying pressure to the keyboard input area. In addition, referring to FIG. 27, as another example of the display device 15 according to this embodiment, it may include a volume control area indicated by area D. In this instance, the operation signal may be a volume control signal that allows a user to adjust the volume by applying pressure to the volume control area.

The structure in which the island patterns 1100 are arranged in the grid pattern as shown in FIG. 28 may be disposed entirely on the display panel PNL of the display device 15 of FIG. 26 and the display device 15 of FIG. 27 or may be disposed only in areas C and D. When pressure is applied to the display panel PNL, the display panel PNL may be switched from the first state to the second state. Accordingly, in this instance, when the elastic member of the sensor SN is compressed by external pressure, the pressure sensing material layer 3505 disposed in the elastic members may also be compressed.

In some embodiments of the present disclosure, the pressure sensing material layer 3505 may include a polymer layer made of a conductive polymer, such as polyvinylidene fluoride, and one selected from the group consisting of: metal nanoparticles, carbon nanotubes, graphene oxide and liquid metal as an additive for changing the resistance value when pressure is applied. In the following description, the pressure sensing material layer 3505 includes a polymer layer 3515 containing polyvinylidene fluoride and carbon nanotubes 3535 as an additive, for convenience of illustration.

Referring to FIGS. 29 and 30, the pressure sensing material layer 3505 may include a polymer layer 3515 containing polyvinylidene fluoride and carbon nanotubes 3535 as an additive. The carbon nanotubes 3535 are conductive materials. In the first state, the carbon nanotubes 3535 may be connected with one another in the pressure sensing material layer 3505 to form conductive paths CDP to lower the electrical resistance, as shown in FIG. 29. As the display panel PNL is switched from the first state to the second state, the pressure sensing material layer 3505 may be compressed as shown in FIG. 30. When this happens, the distance between the carbon nanotubes 3535 may be further decreased compared to that in the first state, and thus the connection between the carbon nanotubes 3535 may be added and the conductive paths CDP may become larger. In other words, more of the carbon nanotubes 3535 may be included in the conductive paths CDP. As a result, the resistance value of the sensing material layer 3500 may 3500 may decrease. It should be noted that the carbon nanotubes 3535 are added as an additive in this instance, and thus a change in the resistance value of the sensing material layer 3500 may vary depending on the type of the additive. For example, when the pressure sensing material layer 3500 is compressed, the resistance value of the pressure sensing material layer 3500 may even decrease depending on the type of additive.

If the connection between the carbon nanotubes 3535 is added and the conductive paths CDP become larger, so that the resistance value of the sensing material layer 3500 decreases, the current value flowing through the sensing material layer 3500 increases. The sensing material layer 3500 may sense the current and may transmit a sensing signal to the controller CTR through the first sensing lines 3100 and the second sensing lines 3300. The controller CTR may analyze the sensing signal from the sensing material layers 3500 to determine the position of the maximum curvature region MXR. The controller CTR may transmit the above-described operation signal to the display device 15 to allow characters typed on the keyboard to be input as in the example shown in FIG. 26 or to allow the volume to be adjusted as in the example shown in FIG. 27.

Figure 31:
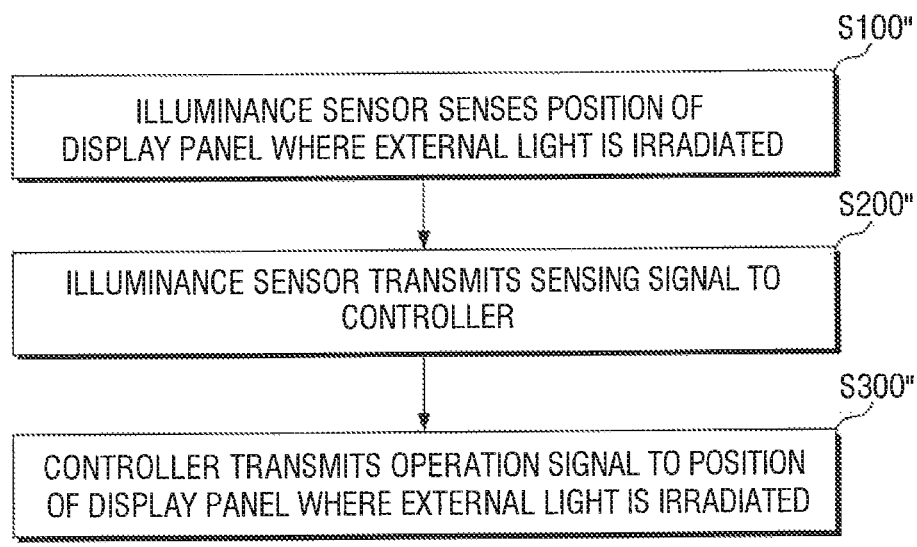
FIG. 31 is a flowchart for illustrating a method of controlling a display device according to yet another embodiment of the present disclosure.
Figure 32:
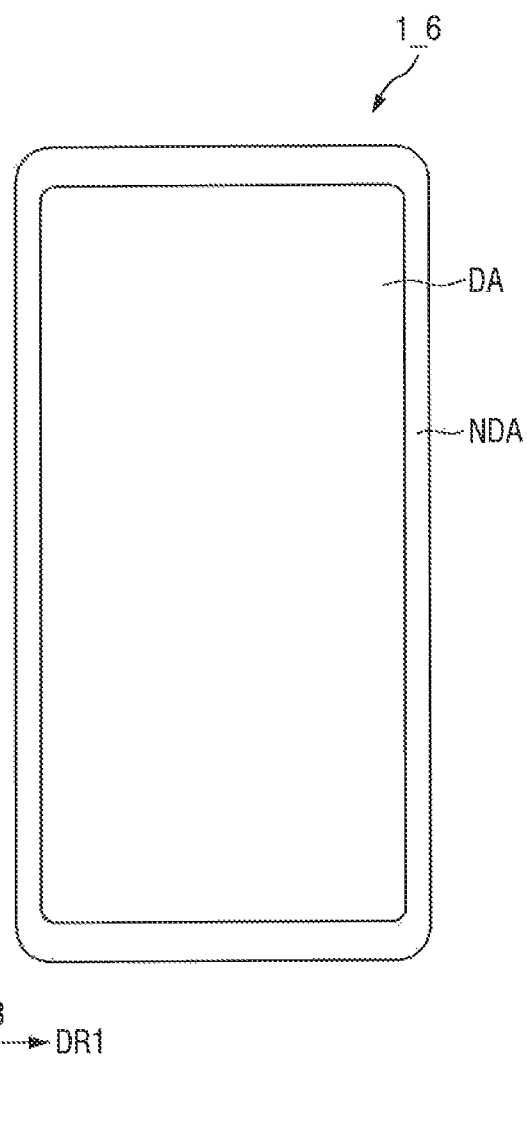
FIG. 32 is a plan view showing an example of the display device according to the embodiment of FIG. 31.
Figure 33:
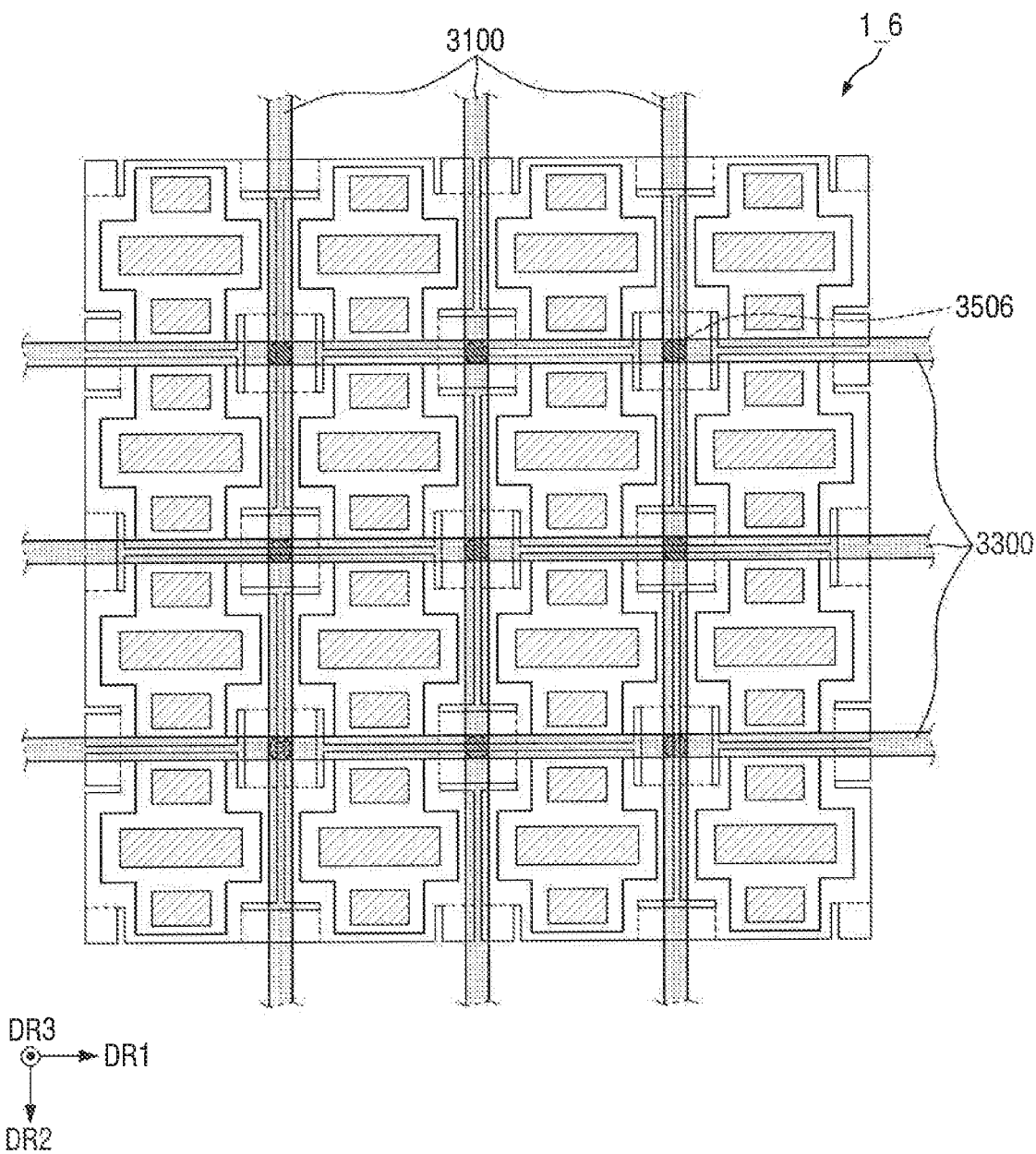
FIG. 33 is a plan view showing a layout of first sensing lines and second sensing lines of the display device of FIG. 31.
Figure 34:
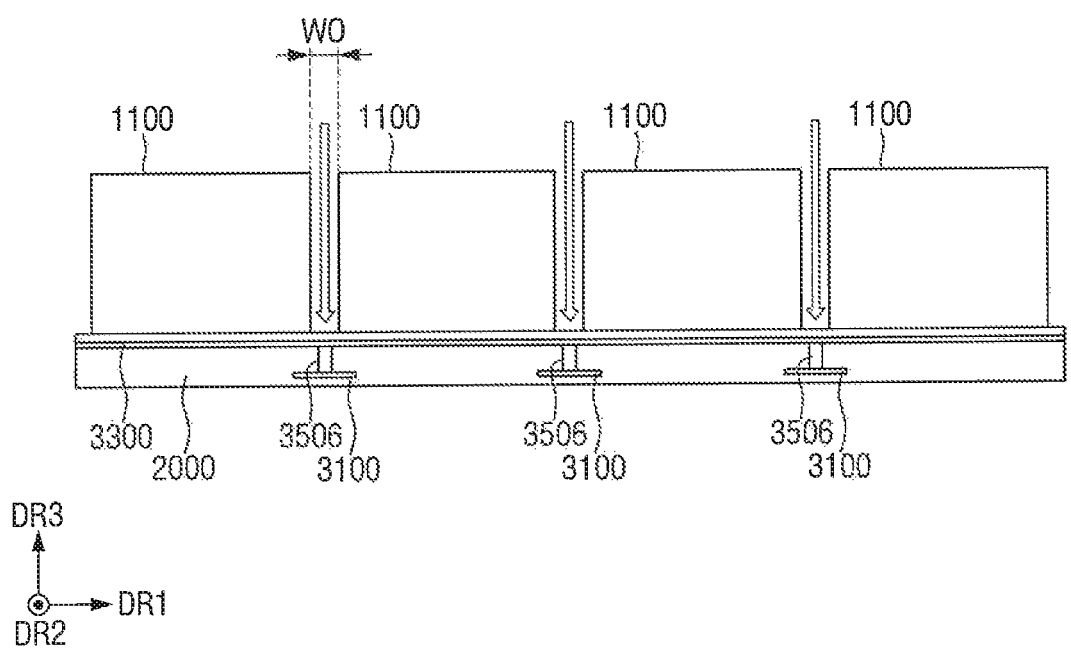
FIG. 34 is a view schematically showing a process of sensing external light by an illuminance sensing material layer of FIG. 31.

FIG. 31 is a flowchart for illustrating a method of controlling a display device according to yet another embodiment of the present disclosure. FIG. 32 is a plan view showing an example of the display device according to the embodiment of FIG. 31. FIG. 33 is a plan view showing a layout of first sensing lines and second sensing lines of the display device of FIG. 31. FIG. 34 is a view schematically showing a process of sensing external light by an illuminance sensing material layer of FIG. 31.

Referring to FIGS. 31 to 34, a sensing material layer 3500 of a display device 1_6 according to this embodiment may be an illuminance sensing material layer 3506 that senses the illuminance of external light irradiated onto the display panel PNL. For example, the illuminance sensing material layer 3506 may receive the light irradiated onto the slits SL of the display panel PNL and sense the intensity of the irradiated light.

Referring to FIG. 31, the method of controlling a display device 1_6 according to the embodiment may include sensing, by the illuminance sensing material layer 3506, a position of the display panel PNL where external light is irradiated when the light is irradiated onto the display panel PNL (step S100″); transmitting, by the illuminance sensing material layer 3506, a sensing signal generated by the light to the controller CTR (step S200″); and determining, by the controller CTR, the position of the display panel PNL based on the sensing signal transmitted from the illuminance sensing material layer 3506, and transmitting an operation signal to the position of the display panel PNL where the light is irradiated (step S300″).

Referring to FIG. 32, the display device 1_6 according to this embodiment may include a display area DA where images are displayed and a non-display area NDA where no image is displayed. When external light is irradiated onto the display area DA, the emission intensity of the display area DA may be increased to more clearly display images to a user. In this instance, the operation signal may be a brightness control signal that provides brighter images to a user.

The structure in which the island patterns 1100 are arranged in the grid pattern as shown in FIG. 33 may be disposed entirely or partially on the display panel PNL. In addition, as shown in FIG. 33, the structure in which the island patterns 1100 are disposed in the grid pattern may be disposed in the non-display area NDA as well as the display area DA depending on processing steps.

Referring to FIG. 34, since the width W0 of the slits SL between the island patterns 1100 may be several micrometers (μm) as described above, sufficient space for external light to be irradiated can be obtained. In this instance, while the illuminance of the external light transmitting the island patterns 1100 becomes weaker, the external light transmitting the slits SL instead of the island patterns 1100 may have a stronger luminance than the luminance of the external light transmitting the island patterns 1100. In other words, since the external light does not transmit the island patterns 1100 and is irradiated directly to the illuminance sensing material layer 3506 through the slits SL, the illuminance sensing material layer 3506 can sense the external light with high sensitivity. Accordingly, it is possible to more easily adjust the brightness of the display area DA.

In concluding the detailed description, those skilled in the art will appreciate that many variations and modifications can be made to the disclosed embodiments without substantially departing from the principles of the present invention. Therefore, the disclosed embodiments of the invention are used in a generic and descriptive sense and not for purposes of limitation.

What is claimed is:

1. A display device, comprising:
a display panel comprising an elongated portion having elasticity, a display portion disposed on an upper surface of the elongated portion and a sensor embedded within the elongated portion; and
a controller receiving a sensing signal from the sensor and providing a control signal to the display panel in response to the sensing signal,
wherein the display portion comprises a slit and a plurality of island patterns spaced apart from one another with the slit therebetween and each of the island patterns comprises a pixel,
wherein the sensor comprises:
a first sensing line extended in a second direction;
a second sensing line extended in a first direction intersecting the second direction; and
a sensing material layer disposed where the first sensing line and the second sensing line intersect each other, and electrically connecting the first sensing line with the second sensing line, and
wherein the sensing material layer overlaps the slit.

2. The display device of claim 1,
wherein the first sensing line, the second sensing line and the sensing material layer are elongated, and a resistance value of the sensing material layer varies depending on an elongation degree.

3. The display device of claim 1,
wherein the sensing material layer is a strain sensing material layer for sensing a curvature of the display panel.

4. The display device of claim 3,
wherein the display panel comprises a maximum curvature region that is curved to a maximum, and
wherein the control signal displays images on a first side of the maximum curvature region of the display panel in response to the sensing signal and does not display images on a second side opposite the first side of the maximum curvature region of the display panel.

5. The display device of claim 1,
wherein the sensing material layer is a pressure sensing material layer that senses an external pressure applied to the display panel.

6. The display device of claim 5,
wherein the control signal performs an operation corresponding to a position at which the external pressure is applied to the display panel in response to the sensing signal.

7. The display device of claim 1,
wherein the slit exposes the upper surface of the elongated portion, and wherein the sensing material layer is an illuminance sensing material layer that senses external light irradiated to the display panel.

8. The display device of claim 7,
wherein the control signal adjusts brightness at a position where the external light is irradiated in response to the sensing signal.

* * * * *